United States Patent
Choi et al.

(10) Patent No.: US 12,439,754 B2
(45) Date of Patent: Oct. 7, 2025

(54) DISPLAY DEVICE HAVING BUMPS OF DIFFERENT ELASTIC MODULI

(71) Applicant: Samsung Display Co., LTD., Yongin-si (KR)

(72) Inventors: Nak Cho Choi, Yongin-si (KR); Sang Woo An, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 537 days.

(21) Appl. No.: 17/880,303

(22) Filed: Aug. 3, 2022

(65) Prior Publication Data
US 2023/0138402 A1    May 4, 2023

(30) Foreign Application Priority Data

Nov. 1, 2021    (KR) .......................... 10-2021-0148194

(51) Int. Cl.
*H10H 20/857* (2025.01)
*H01L 25/075* (2006.01)
*H10H 20/01* (2025.01)

(52) U.S. Cl.
CPC ....... *H10H 20/857* (2025.01); *H01L 25/0753* (2013.01); *H10H 20/0364* (2025.01)

(58) Field of Classification Search
CPC . H01L 25/0753; H10H 20/857; H10H 29/857
See application file for complete search history.

(56) References Cited

U.S. PATENT DOCUMENTS

| | | | |
|---|---|---|---|
| 9,076,739 B2 | 7/2015 | Choi et al. | |
| 9,177,899 B2 | 11/2015 | Lin et al. | |
| 10,446,604 B2* | 10/2019 | Chiang | H10H 20/812 |
| 11,164,805 B2 | 11/2021 | Kim et al. | |
| 11,562,669 B2 | 1/2023 | Kim | |
| 2005/0002428 A1* | 1/2005 | Kwak | H01S 5/0206 372/36 |
| 2011/0089577 A1 | 4/2011 | Eom et al. | |
| 2015/0041980 A1 | 2/2015 | Ahn et al. | |
| 2020/0235077 A1* | 7/2020 | Jeon | H01L 22/12 |
| 2021/0050336 A1 | 2/2021 | Koo et al. | |
| 2021/0066243 A1 | 3/2021 | Lee et al. | |
| 2021/0119098 A1 | 4/2021 | Kajiyama et al. | |
| 2021/0210371 A1* | 7/2021 | Chen | H01L 24/83 |
| 2021/0265542 A1 | 8/2021 | Ogawa | |

(Continued)

FOREIGN PATENT DOCUMENTS

| | | |
|---|---|---|
| JP | 2009-38057 A | 2/2009 |
| JP | 4888650 B2 | 2/2012 |

(Continued)

*Primary Examiner* — Kevin Parendo
(74) *Attorney, Agent, or Firm* — Womble Bond Dickinson (US) LLP

(57) ABSTRACT

A display device includes: a substrate; a pixel circuit layer on the substrate; a first connection electrode and a second connection electrode on the pixel circuit layer; a first bump on the first connection electrode, and a second bump on the second connection electrode, the first bump and the second bump including materials having different elastic moduli; and a light-emitting element including a first electrode electrically connected to the first connection electrode and a second electrode electrically connected to the second connection electrode.

33 Claims, 20 Drawing Sheets

(56) References Cited

U.S. PATENT DOCUMENTS

2021/0325711 A1  10/2021  Choi et al.
2021/0376211 A1  12/2021  Song

FOREIGN PATENT DOCUMENTS

| JP | 2021-135328 A | 9/2021 |
|---|---|---|
| KR | 10-0761596 B1 | 9/2007 |
| KR | 10-2014-0023512 A | 2/2014 |
| KR | 10-1381644 B1 | 4/2014 |
| KR | 10-2014-0142627 | 12/2014 |
| KR | 10-1514137 B1 | 4/2015 |
| KR | 10-1731198 B1 | 4/2017 |
| KR | 10-2020-0021858 | 3/2020 |
| KR | 10-2021-0019323 A | 2/2021 |
| KR | 10-2021-0022734 A | 3/2021 |
| KR | 10-2021-0024866 A | 3/2021 |
| KR | 10-2021-0027848 A | 3/2021 |
| KR | 10-2021-0064238 A | 6/2021 |
| KR | 10-2021-0127272 | 10/2021 |

\* cited by examiner

FIG. 10

| physical property | hardness(Gpa) | elastic modulus(Gpa) | indentation depth(μm) |
|---|---|---|---|
| first embodiment | 0.41 | 7.7 | 0.14 |
| second embodiment | 0.32 | 7.0 | 0.16 |
| third embodiment | 0.31 | 6.9 | 0.16 |

FIG. 13

| physical property | indentation depth(μm) |
|---|---|
| first embodiment | 0.11 |
| second embodiment | 0.13 |
| third embodiment | 0.13 |

FIG. 16

| physical property | indentation depth(μm) | elastic strain(%) |
|---|---|---|
| first embodiment | 0.03 | 70 |
| second embodiment | 0.06 | 56 |
| third embodiment | 0.08 | 43 |

DISPLAY DEVICE HAVING BUMPS OF DIFFERENT ELASTIC MODULI

CROSS-REFERENCE TO RELATED APPLICATION

This application claims priority to and the benefit of Korean Patent Application No. 10-2021-0148194, filed in the Korean Intellectual Property Office on Nov. 1, 2021, the entire content of which is incorporated herein by reference.

BACKGROUND

1. Field

Aspects of embodiments of the present disclosure relate to a display device and a method of manufacturing the same.

2. Description of the Related Art

As interest in information displays and demands for the use of portable information media increase, demands and commercialization of display devices are being actively performed.

SUMMARY

The present disclosure is directed to a display device exhibits improved bonding force between a light-emitting element and a substrate and a method of manufacturing the same.

A display device according to one embodiment of the present disclosure includes a substrate, a pixel circuit layer on the substrate, a first connection electrode and a second connection electrode on the pixel circuit layer, a first bump on the first connection electrode, a second bump on the second connection electrode, and a light-emitting element including a first electrode electrically connected to the first connection electrode and a second electrode electrically connected to the second connection electrode. The first bump and the second bump include materials having different elastic moduli.

The elastic modulus of the first bump may be greater than the elastic modulus of the second bump.

The first bump and the second bump may include an organic material or a metal material.

The first bump may include a positive photoresist material, and the second bump may include a negative photoresist material.

A height of the second bump may be lower than a height of the first bump, and a diameter of the second bump may be greater than a diameter of the first bump.

The light-emitting element may include a semiconductor structure having one surface with different heights and that is configured to emit light. The first electrode may be on the one surface of the semiconductor structure, and the second electrode may be on the one surface of the semiconductor structure and is different from the first electrode.

The first electrode may be at a lower level on the one surface of the semiconductor structure, and the second electrode may be at a higher level on the one surface of the semiconductor structure.

The semiconductor structure may include a first semiconductor layer, an active layer at one side of the first semiconductor layer, and a second semiconductor layer at one side of the active layer and that is a different type from the first semiconductor layer.

The pixel circuit layer may include a transistor on the substrate and a plurality of via layers on the transistor. The transistor may include a semiconductor pattern, a first source electrode, a first drain electrode, and a gate electrode, and the first drain electrode of the transistor may be electrically connected to the first connection electrode through contact openings in the plurality of via layers.

The display device may further include a third connection electrode covering the first bump and at least partially overlapping the first connection electrode, and a fourth connection electrode covering the second bump and at least partially overlapping the second connection electrode.

The display device may further include an insulating film between the light-emitting element and the third and fourth connection electrodes.

A display device according to one embodiment includes a substrate, a pixel circuit layer on the substrate, a via layer on the pixel circuit layer, a first connection electrode and a second connection electrode on the pixel circuit layer, a first bump on the first connection electrode, a second bump on the second connection electrode, and a light-emitting element including a first electrode electrically connected to the first connection electrode and a second electrode electrically connected to the second connection electrode. The first bump and the second bump include materials having different elastic moduli, and the second bump and the via layer include the same material.

The elastic modulus of the first bump may be greater than the elastic modulus of the second bump.

The via layer, the first bump, and the second bump may include an organic material.

A height of the second bump may be lower than a height of the first bump, and a diameter of the second bump may be greater than a diameter of the first bump.

The light-emitting element may include a semiconductor structure having one surface having different heights and that is configured to emit light. The first electrode may be on the one surface of the semiconductor structure, and the second electrode may be on the one surface of the semiconductor structure and is different from the first electrode.

The first electrode may be at a lower level on the one surface of the semiconductor structure, and the second electrode may be at a higher level on the one surface of the semiconductor structure.

A method of manufacturing a display device according to one embodiment includes providing a pixel circuit layer including a transistor on a substrate; providing a first connection electrode, a second connection electrode, a first bump, a second bump, and a via layer on the pixel circuit layer; arranging a light-emitting element including a first electrode and a second electrode on the substrate; and coupling the light-emitting element and the substrate such that the first electrode of the light-emitting element overlaps the first bump and the second electrode of the light-emitting element overlaps the second bump. The first bump and the second bump include materials having different elastic moduli.

Before the light-emitting element and the substrate are coupled, a height of the first bump and a height of the second bump may be the same.

After the light-emitting element and the substrate are coupled, the height of the first bump may be higher than the height of the second bump.

BRIEF DESCRIPTION OF THE DRAWINGS

FIG. 10 is a table describing the experiment results relevant to FIG. 8

FIG. 13 is a table describing the experiment results relevant to FIG. 11.

FIG. 16 is a table describing the experiment results relevant to FIG. 14.

DETAILED DESCRIPTION

Figure 1:
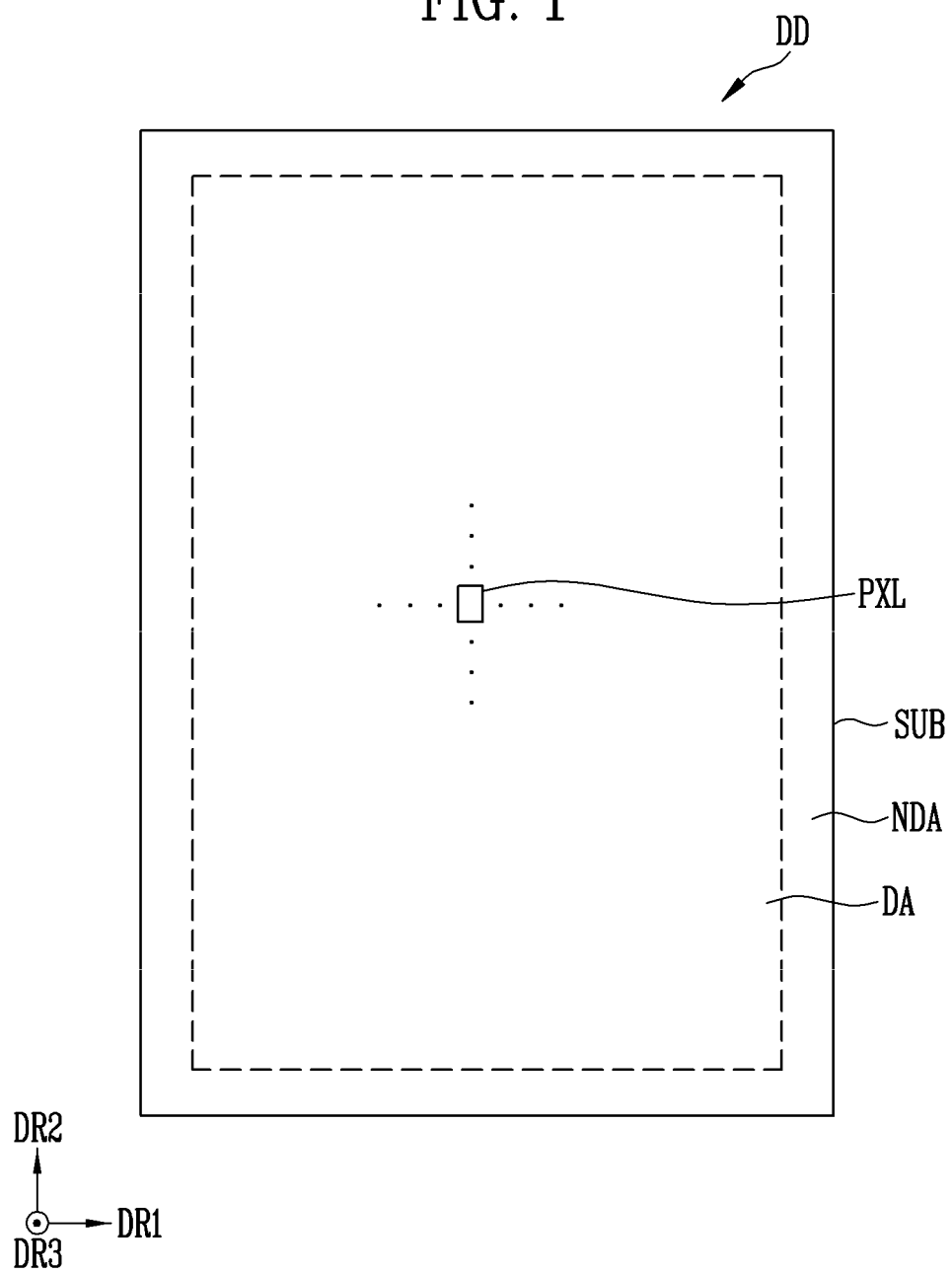
FIG. 1 is a schematic plan view illustrating a display device according to an embodiment.

While the present disclosure is open to various modifications and alternative embodiments, some embodiments thereof will be described and illustrated by way of example in the accompanying drawings. However, it should be understood that there is no intention that the present disclosure be limited to the embodiments disclosed herein. On the contrary, the present disclosure covers all modifications, equivalents, and alternatives falling within the spirit and scope of the present disclosure.

Although the terms "first," "second," and the like are used herein to describe various elements, these elements should not be limited by these terms. The terms are used only for the purpose of distinguishing one element from another element. For example, without departing from the scope of the present disclosure, a first element could be termed a second element, and similarly a second element could be also termed a first element. A single form of expression is meant to include multiple elements unless otherwise stated.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be understood that the terms "has," "having," "comprises," "comprising," "includes," and/or "including," when used in this specification, specify the presence of stated features, integers, steps, operations, elements, components, and/or combinations thereof but do not preclude the presence or addition of one or more other features, integers, steps, operations, elements, components, and/or combinations thereof.

A display device according to embodiments of the present disclosure will be described with reference to drawings related to the embodiments of the present disclosure.

Figure 2:
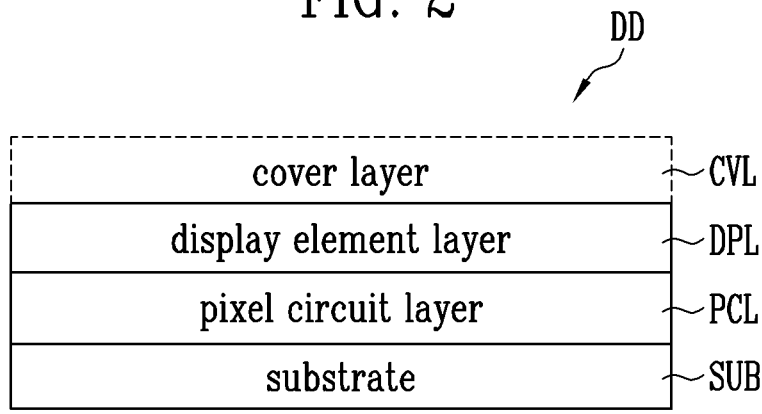
FIG. 2 is a schematic cross-sectional view illustrating the display device shown in FIG. 1.

FIG. 1 is a schematic plan view illustrating a display device according to an embodiment, and FIG. 2 is a schematic cross-sectional view illustrating the display device shown in FIG. 1.

Referring to FIG. 1, a display device DD according to an embodiment may have a display area DA in which an image is displayed and a non-display area NDA in which an image is not displayed. The non-display area NDA may be provided on at least one side of the display area DA and may be provided to surround (e.g., to surround in a plan view or to extend around a periphery of) the display area DA. According to embodiments, the shape of the display area DA and the position of the non-display area NDA may be relatively varied.

The display device DD may be provided in a rectangular plate shape having angled corners, but according to embodiments, the display device DD may have a rectangular plate shape with rounded corners. In addition, the present disclosure is not limited thereto, and the display device DD may be implemented in various shapes.

The display device DD according to one embodiment may be applied to an electronic device, in which a display surface is applied to at least one surface thereof, such as a smartphone, a television, a tablet personal computer (PC), a mobile phone, an image phone, an e-book reader, a desktop PC, a laptop PC, a netbook computer, a workstation, a server, a personal digital assistant (PDA), a portable multimedia player (PMP), an MP3 player, a medical device, a camera, or a wearable device.

In addition, the display device DD according to an embodiment may include a self-luminous display panel, such as any one of a nano-scale or micro-scale light-emitting diode (LED) display panel, a quantum dot organic light-emitting display panel (QD OLED panel), and the like.

The display device DD may include a substrate SUB and a plurality of pixels PXL disposed on the substrate SUB.

The substrate SUB may constitute a base member of the display device DD. According to embodiments, the substrate SUB may be a rigid or flexible substrate or film, and the material or properties thereof are not particularly limited. As an example, the substrate SUB may be a rigid substrate including (or made of) glass or tempered glass, a flexible substrate (or a thin film) including (or made of) plastic or metal, or at least one insulating film, but the material and/or physical properties thereof are not particularly limited.

The plurality of pixels PXL may be positioned in the display area DA, and lines, pads, and a driving circuit connected to the pixels PXL in the display area DA may be selectively positioned in the non-display area NDA.

Although only one pixel PXL is illustrated in FIG. 1, the plurality of pixels PXL may be substantially dispersed in the display area DA. For example, the pixels PXL may be disposed in the display area DA in an arrangement structure, such as a matrix or a stripe. However, the present disclosure is not limited thereto.

Referring to FIG. 2, the display device DD may include a pixel circuit layer PCL, a display element layer DPL, and a cover layer CVL which are sequentially disposed on the substrate SUB.

The pixel circuit layer PCL may be disposed on the substrate SUB and may include a plurality of transistors, capacitors, and signal lines connected to the plurality of transistors. For example, each transistor may have a form in which a semiconductor pattern, a gate electrode, a source electrode, and a drain electrode are sequentially stacked with insulating layers interposed therebetween.

The display element layer DPL may be disposed on the pixel circuit layer PCL and may include light-emitting elements. For example, the light-emitting element may be an inorganic light-emitting element or a light-emitting element which emits light by changing a wavelength of light emitted by using quantum dots.

The cover layer CVL may be disposed on the display element layer DPL. The cover layer CVL may be in the form of an encapsulation substrate or an encapsulation film formed as a multi-layer film. When the cover layer CVL is in the form of the encapsulation film, the cover layer CVL may have a form in which an inorganic film, an organic film, and an inorganic film are sequentially stacked. The cover layer CVL may prevent or substantially prevent external air and moisture from permeating into the display element layer DPL and the pixel circuit layer PCL.

According to embodiments, the cover layer CVL may include (or may be made of) a thermosetting resin and/or a photocurable resin, applied on the substrate SUB in a liquid form, and then cured through a curing process by using heat and/or light. In such an embodiment, the cover layer CVL may protect the light-emitting element and stably fix the light-emitting element.

In addition, the cover layer CVL may include an anti-reflective (AR) film.

Figure 3:
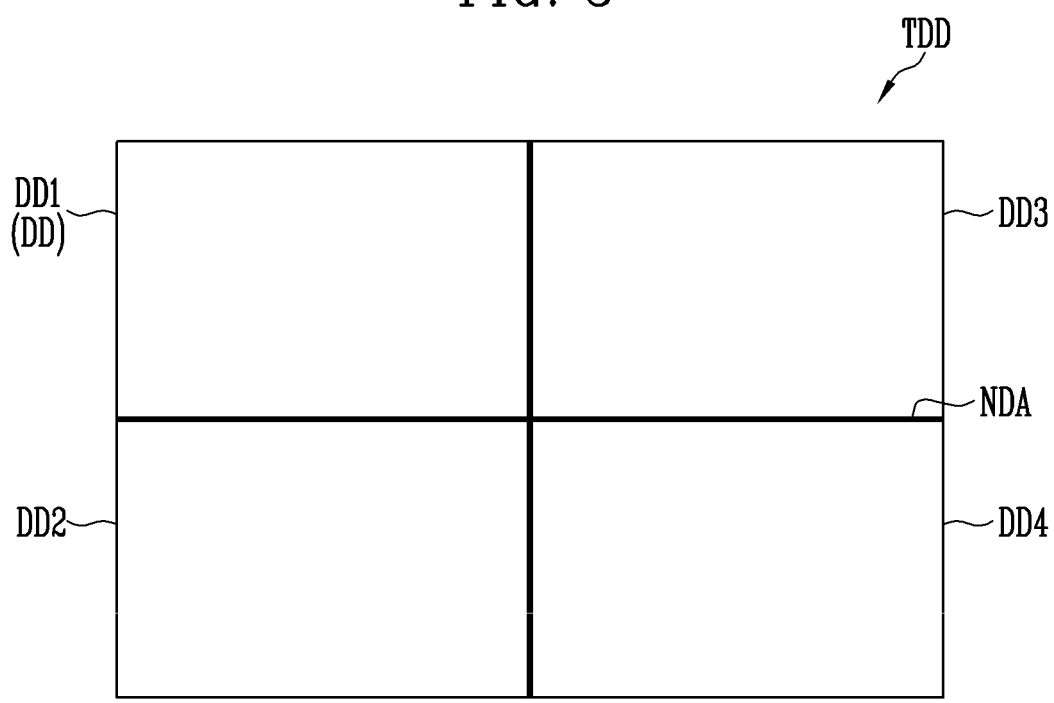
FIG. 3 is a plan view illustrating a multi-screen display device implementable using a display device according to an embodiment.

FIG. 3 is a plan view illustrating a multi-screen display device implementable using a display device according to an embodiment.

Referring to FIG. 3, a display device according to an embodiment may be a multi-screen display device TDD including a plurality of display devices.

The multi-screen display device TDD (also referred to as a tiled display) may include a plurality of display devices DD1, DD2, DD3, and DD4 arranged in a matrix form along a first direction DR1 and a second direction DR2. Here, one display device DD1 may be the display device DD shown in FIGS. 1 and 2 and described above.

The plurality of display devices DD1, DD2, DD3, and DD4 may display individual images or divide and display one image. The plurality of display devices DD1, DD2, DD3, and DD4 may include display panels having the same type, structure, size, or method, but the present disclosure is not limited thereto.

The plurality of display devices DD1, DD2, DD3, and DD4 may be physically coupled by a housing, which may be positioned below the plurality of display devices DD1, DD2, DD3, and DD4 to constitute one multi-screen display device TDD.

The plurality of display devices DD1, DD2, DD3, and DD4 may be implemented in various shapes. Although the plurality of display devices DD1, DD2, DD3, and DD4 are illustrated in FIG. 3 as having a rectangular plate shape, the present disclosure is not limited thereto The plurality of display devices DD1, DD2, DD3, and DD4 may have a shape such as a circular shape or an oval shape.

Hereinafter, a pixel included in a display device according to an embodiment will be described with reference to FIG. 4.

Figure 4:
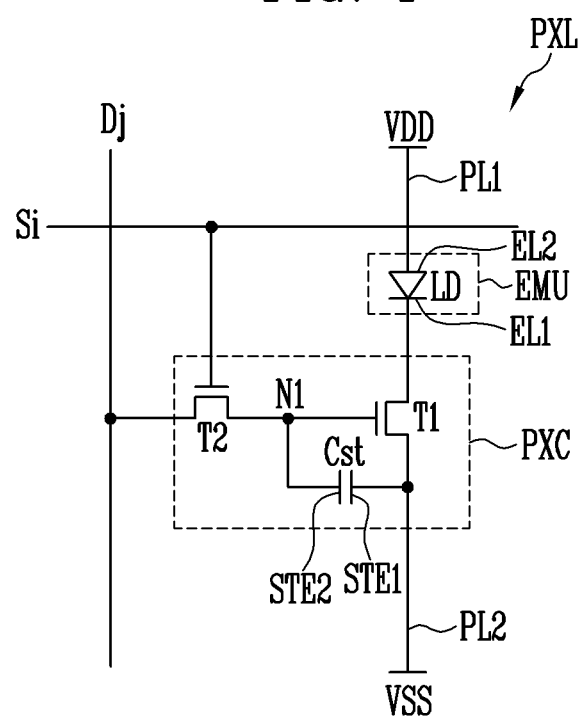
FIG. 4 is a circuit diagram illustrating an electrical connection relationship of one pixel included in a display device according to an embodiment.

FIG. 4 is a circuit diagram illustrating an electrical connection relationship of one pixel included in a display device according to an embodiment.

Referring to FIG. 4, a pixel PXL according to an embodiment may include a light-emitting unit EMU for generating light having luminance corresponding to a data signal and a pixel circuit PXC for driving the light-emitting unit EMU.

The light-emitting unit EMU may include a light-emitting element LD connected between a first power line PL1, to which a voltage of a first driving power source VDD is applied, and a second power line PL2, to which a voltage of a second driving power source VSS is applied.

The light-emitting element LD may include a second electrode EL2 connected to the first driving power source VDD through the first power line PL1 and a first electrode EL1 connected to the second driving power source VSS through the second power line PL2. In one embodiment, the first electrode EL1 may be a cathode, and the second electrode EL2 may be an anode.

The light-emitting element LD may emit light at a luminance corresponding to a driving current supplied through the pixel circuit PXC, to be described below. For example, during each frame period, the pixel circuit PXC may supply a driving current corresponding to a gradation value of corresponding frame data to the light-emitting unit EMU. The driving current supplied to the light-emitting unit EMU may flow in (or through) the light-emitting element LD, and the light-emitting element LD may emit light at luminance corresponding to the driving current.

The pixel circuit PXC may be connected to a scan line Si and a data line Dj. When it is assumed that the pixel PXL is disposed in an $i^{th}$ row and a $j^{th}$ column of a display area DA (see, e.g., FIG. 1) (wherein i is a natural number, and j is a natural number), the pixel circuit PXC may be connected to an i$^{th}$ scan line Si and a j$^{th}$ data line Dj in the display area DA.

In addition, the pixel circuit PXC may include a first transistor T1, a second transistor T2, and a storage capacitor Cst.

The first transistor T1 may be a driving transistor for controlling a driving current applied to the light-emitting unit EMU and may be connected between the light-emitting unit EMU and the second driving power source VSS. For example, a first terminal of the first transistor T1 may be connected to the light-emitting unit EMU, a second terminal of the first transistor T1 may be connected to the second driving power source VSS through the second power line PL2, and a gate electrode of the first transistor T1 may be connected to a first node N1. The first transistor T1 may control an amount of a driving current flowing to the light-emitting unit EMU from the first driving power source VDD according to a voltage applied to the first node N1. In one embodiment, the first terminal of the first transistor T1 may be a drain electrode, and the second terminal of the first transistor T1 may be a source electrode.

The second transistor T2 may be a switching transistor, which selects the pixel PXL in response to a scan signal applied to the scan line Si and activates the pixel PXL and may be connected between the data line Dj and the first node N1. A first terminal of the second transistor T2 may be connected to the data line Dj, a second terminal of the second transistor T2 may be connected to the first node N1, and a gate electrode of the second transistor T2 may be connected to the scan line Si.

When a scan signal having a gate-on voltage (for example, a high level voltage) is supplied from (or by) the scan line Si, the second transistor T2 may be turned on to electrically connect the data line Dj and the first node N1. The first node N1 may be a point at which the second terminal of the second transistor T2 and the gate electrode of the first transistor T1 are connected, and the second transistor T2 may transmit a data signal to the gate electrode of the first transistor T1.

One electrode (e.g., a first storage electrode) STE1 of the storage capacitor Cst may be connected to the second driving power source VSS, and the other electrode (e.g., a second storage electrode) STE2 of the storage capacitor Cst may be connected to the first node N1. The storage capacitor Cst may be charged with a voltage corresponding to a data signal supplied to the first node N1 and may maintain the charged voltage until a data signal of a next frame is supplied.

The present disclosure is not limited to the structure shown in FIG. 4, and the structure of the pixel circuit PXC may be variously changed. According to embodiments, the pixel circuit PXC may further include a sensing transistor, an emission control transistor, a parasitic capacitor, and the like in addition to the transistors shown in FIG. 4.

Hereinafter, the light-emitting element described with reference to FIG. 4 will be described in more detail with reference to FIG. 5.

Figure 5:
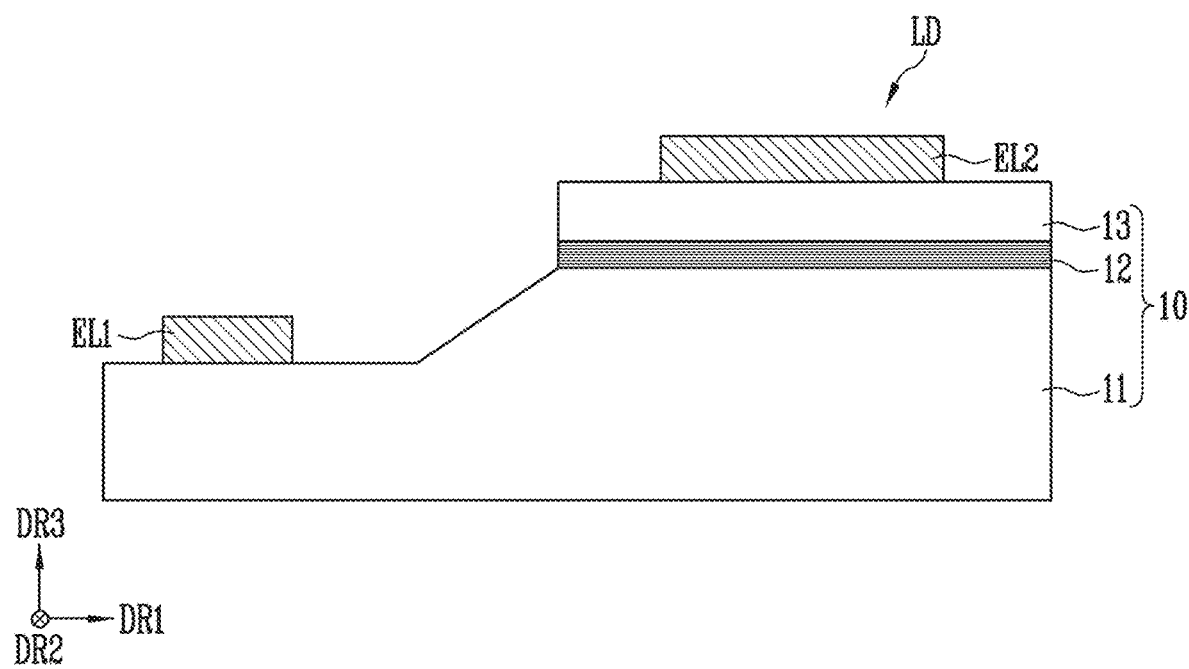
FIG. 5 is a cross-sectional view illustrating a light-emitting element included in a display device according to an embodiment.

FIG. 5 is a cross-sectional view illustrating a light-emitting element included in a display device according to one embodiment.

Referring to FIG. 5, a light-emitting element LD according to an embodiment may include a semiconductor structure 10, a first electrode EL1, and a second electrode EL2.

The semiconductor structure 10 may emit light according to recombination of electrons and holes according to a current flowing between the first electrode EL1 and the second electrode EL2. By controlling light emission of the light-emitting element LD by using such a principle, the light-emitting element LD may be used as a light source (or a light-emitting source) of various display devices (or light-emitting devices).

A first semiconductor layer 11 may include, for example, at least one n-type semiconductor layer. For example, the first semiconductor layer 11 may be an n-type semiconductor layer including any one semiconductor material selected from InAlGaN, GaN, AlGaN, InGaN, AlN, and InN and doped with a first conductivity-type dopant (e.g., an n-type dopant), such as silicon (Si), germanium (Ge), or tin (Sn). However, a material constituting (or forming) the first semiconductor layer 11 is not limited thereto, and the first semiconductor layer 11 may include (or may be made of) various suitable materials. In one embodiment of the present disclosure, the first semiconductor layer 11 may include a gallium nitride (GaN) semiconductor material doped with the first conductivity-type dopant (e.g., the n-type dopant).

An active layer 12 may be disposed on one side of the first semiconductor layer 11 and may be formed to have a single or multi-quantum well structure. As an example, when the active layer 12 is formed to have a multi-quantum well structure, a barrier layer, a strain reinforcing layer, and a well layer may be periodically and repeatedly stacked as one unit in the active layer 12. The strain reinforcing layer may have a smaller lattice constant than the barrier layer to further strengthen compressive strain applied to the well layer. However, the structure of the active layer 12 is not limited to the above-described embodiment and may be variously changed according to embodiments.

The active layer 12 may emit light having a wavelength in a range of about 400 nm to about 900 nm and may have a double-hetero structure. In one embodiment, a clad layer doped with a conductivity-type dopant may be formed on an upper portion and/or a lower portion of the active layer 12. As an example, the clad layer may be formed as an AlGaN layer or an InAlGaN layer. According to embodiments, a material such as AlGaN or InAlGaN may be used to form the active layer 12, and in addition, various materials may constitute the active layer 12. The active layer 12 may have a first surface contacting the first semiconductor layer 11 and a second surface contacting a second semiconductor layer 13.

The second semiconductor layer 13 may include a semiconductor layer having a different type from the first semiconductor layer 11. As an example, the second semiconductor layer 13 may include at least one p-type semiconductor layer. For example, the second semiconductor layer 13 may include a p-type semiconductor layer including at least one semiconductor material selected from InAlGaN, GaN, AlGaN, InGaN, AlN, and InN and doped with a second conductivity-type dopant (e.g., a p-type dopant), such as magnesium (Mg). However, a material constituting the second semiconductor layer 13 is not limited thereto, and the second semiconductor layer 13 may be made of various suitable materials. In one embodiment, the second semiconductor layer 13 may include a gallium nitride (GaN) semiconductor material doped with the second conductivity-type dopant (e.g., the p-type dopant).

The second semiconductor layer 13 may be disposed on one side of the active layer 12 and may have a lower surface contacting an upper surface of the active layer 12 and an upper surface contacting the second electrode EL2. The second semiconductor layer 13 may provide holes to the active layer 12.

To form the semiconductor structure 10, the first semiconductor layer 11, the active layer 12, and the second semiconductor layer 13 may be provided as structures that are sequentially stacked on a semiconductor substrate. Here, the semiconductor substrate may include a semiconductor material, such as a sapphire substrate or a silicon substrate. Such a semiconductor substrate may be used as a growth substrate for growing each of the first semiconductor layer 11, the active layer 12, and the second semiconductor layer 13 and then may be separated from the first semiconductor layer 11 through a substrate separating process. The substrate separating process may be a laser lift-off process, a chemical lift-off process, or the like. Accordingly, because the growth semiconductor substrate is removed from the semiconductor structure 10, the semiconductor structure 10 may have a thin thickness. In one embodiment, the semiconductor structure 10 may have a size on a micro-scale, but the present disclosure is not limited thereto.

In one embodiment, the semiconductor structure 10 may include a mesa interface formed to have one surface having different heights and an inclined surface extending along at least a portion of the one surface. The mesa interface may be formed by performing an etching process to remove a portion of each of the second semiconductor layer 13, the active layer 12, and the first semiconductor layer 11. Accordingly, side surfaces of the active layer 12 and/or the second semiconductor layer 13 may be exposed to the outside. The etching process may be, for example, a dry etching process.

The first electrode EL1 may be positioned on one surface of the semiconductor structure 10. The first electrode EL1 may be positioned at a lower level on one surface of the semiconductor structure 10. For example, the first electrode EL1 may be positioned on the first semiconductor layer 11 to be electrically separated from the active layer 12 and the second semiconductor layer 13. In FIG. 5, the first electrode EU is illustrated as being positioned on a portion of an upper surface of the first semiconductor layer 11, but the size of the first electrode EL1 may be variously modified. According to embodiments, an edge of the first electrode EL1 may be positioned to be collinear with an edge of the first semiconductor layer 11.

In one embodiment, the first electrode EU may overlap a first bump (see, e.g., FIG. 7) for bonding the light-emitting element LD.

The second electrode EL2 may be positioned on the one surface of the semiconductor structure 10. The second electrode EL2 may be positioned at a higher level on the one surface of the semiconductor structure 10. For example, the second electrode EL2 may be positioned on the second semiconductor layer 13. In FIG. 5, the second electrode EL2 is illustrated as being positioned on a portion of an upper surface of the second semiconductor layer 13, but the size of the second electrode EL2 may be variously modified. According to embodiments, the second electrode EL2 may be positioned to completely overlap the upper surface of the second semiconductor layer 13.

In one embodiment, the second electrode EL2 may overlap a second bump (see, e.g., FIG. 7) for bonding the light-emitting element LD.

The first electrode EL1 may be a contact electrode in ohmic contact with the first semiconductor layer 11, and the second electrode EL2 may be a contact electrode in ohmic contact with the second semiconductor layer 13. According to embodiments, the first and second additional electrodes EL1 and EL2 may be Schottky contact electrodes.

The first electrode EL1 and the second electrode EL2 may include a conductive material. For example, the first electrode EL1 and the second electrode EL2 may include an opaque metal including chromium (Cr), titanium (Ti), aluminum (Al), gold (Au), nickel (Ni), and an oxide or alloy thereof alone or in a mixture. According to embodiments, the first electrode EL1 and the second electrode EL2 may include a transparent conductive oxide, such as indium tin oxide (ITO), indium zinc oxide (IZO), zinc oxide (ZnO), indium gallium zinc oxide (IGZO), or indium tin zinc oxide (ITZO).

Hereinafter, a detailed configuration of a display device according to one embodiment will be described with reference to FIGS. 6 and 7.

Figure 6:
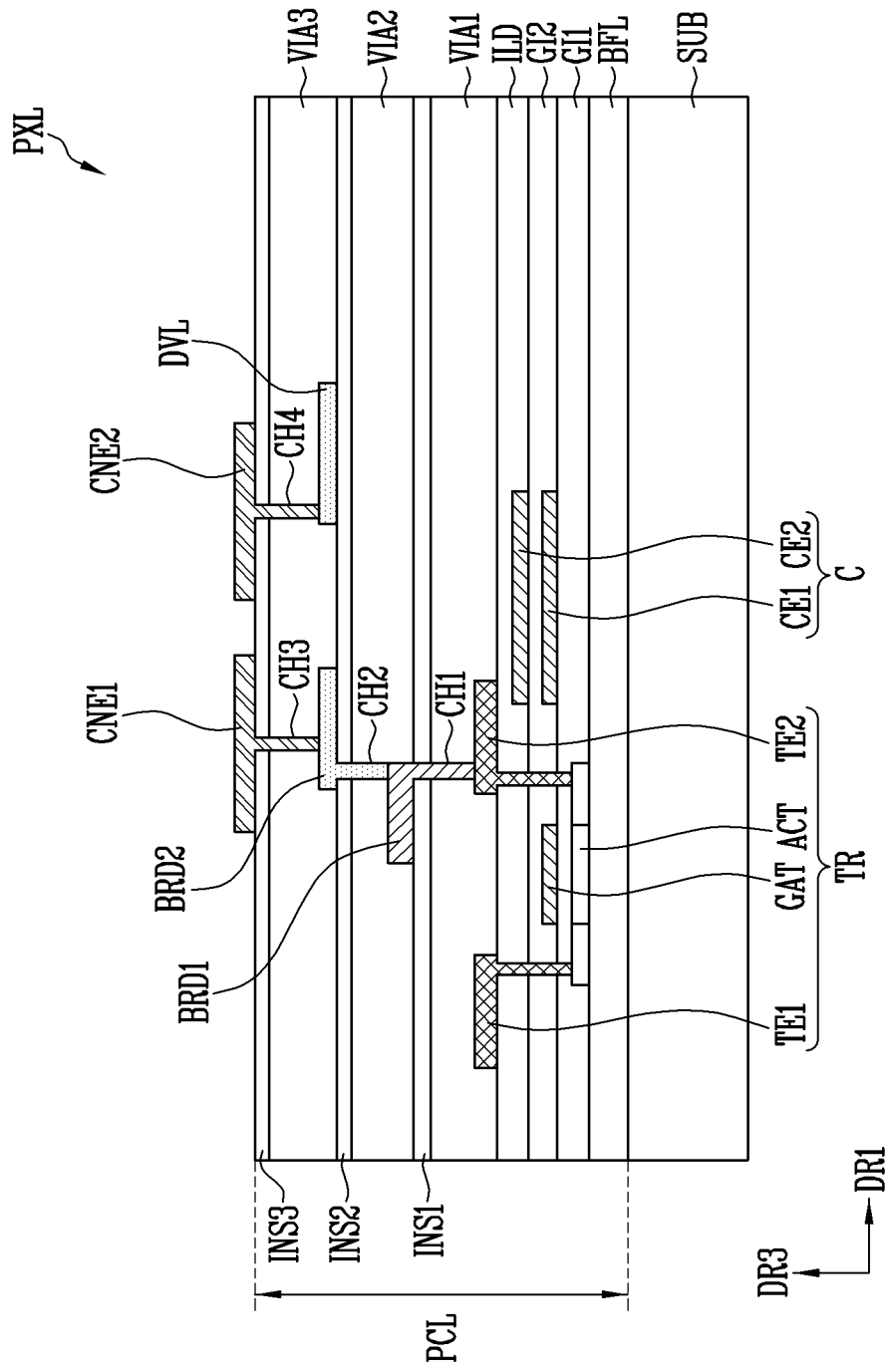
FIGS. 6 and 7 are schematic cross-sectional views illustrating a pixel included in a display device according to an embodiment.
Figure 7:
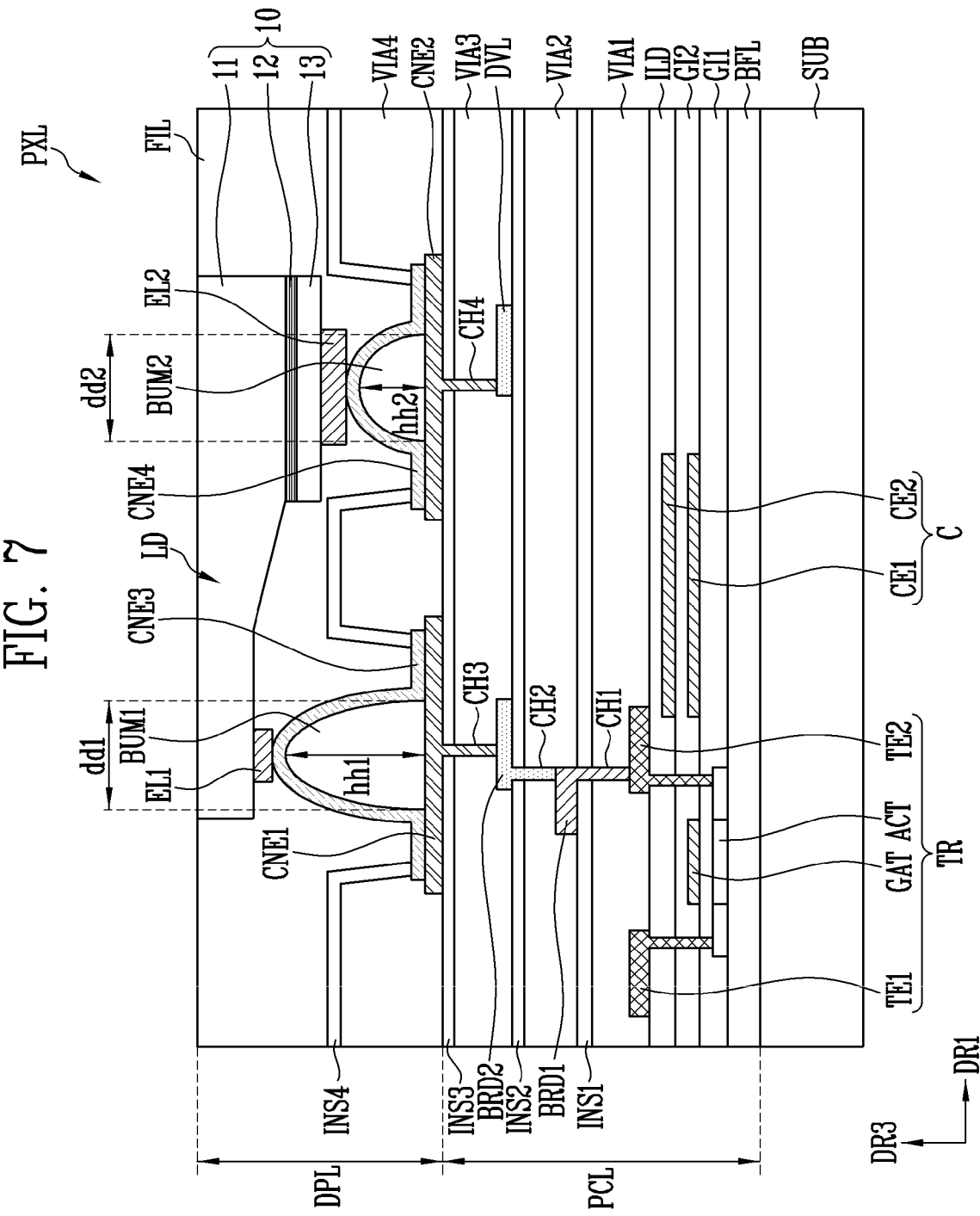

FIGS. 6 and 7 are schematic cross-sectional views illustrating a pixel included in a display device according to one embodiment.

Referring to FIGS. 6 and 7, one pixel PXL included in a display device according to an embodiment may include a substrate SUB, a pixel circuit layer PCL, and a display element layer DPL.

The substrate SUB may be a base layer and may be a rigid substrate or a flexible substrate. For example, when the substrate SUB is rigid, the substrate SUB may be implemented as a glass substrate, a quartz substrate, a glass ceramic substrate, a crystalline glass substrate, or the like. When the substrate SUB is flexible, the substrate SUB may be implemented as a polymer organic substrate including polyimide, polyamide, or the like, a plastic substrate, or the like.

The pixel circuit layer PCL is positioned on the substrate SUB.

The pixel circuit layer PCL may include one or more transistors and a plurality of lines connected thereto. In addition, the pixel circuit layer PCL includes a buffer layer BFL, a plurality of insulating layers GI1, GI2, ILD, INS1, INS2, and INS3, and a plurality of via layers VIA1, VIA2, and VIA3, which are sequentially stacked on one surface of the substrate SUB.

The buffer layer BFL is positioned on the substrate SUB to cover the substrate SUB. The buffer layer BFL may prevent or substantially prevent impurities from diffusing into the pixel circuit layer PCL from the outside. The buffer layer BFL may include at least one selected from metal oxides, such as silicon nitride ($SiN_x$), silicon oxide ($SiO_x$), silicon oxynitride ($SiOxN_y$), and aluminum oxide ($AlO_x$). According to embodiments, the buffer layer BFL may be omitted. In addition, a lower metal layer may be positioned between the substrate SUB and the buffer layer BFL.

A transistor TR may include a semiconductor pattern ACT, a gate electrode GAT, a first source electrode TE1, and a first drain electrode TE2.

The semiconductor pattern ACT is positioned on the buffer layer BFL. The semiconductor pattern ACT may include a channel region and a source region and a drain region positioned at both sides (e.g., opposite sides) of the channel region. The source region of the semiconductor pattern ACT may be electrically connected to the first source electrode TE1, and the drain region thereof may be electrically connected to the first drain electrode TE. For example, the source region and the drain region may be expanded to be electrically connected to electrodes of other layers through contact openings (e.g., contact holes).

The semiconductor patter ACT may include at least one selected from polysilicon, amorphous silicon, and an oxide semiconductor.

From among the plurality of insulating layers GI1, GI2, ILD, INS1, INS2, and INS3, a first gate insulating layer Gil is disposed on the semiconductor pattern ACT and the buffer layer BFL. The first gate insulating layer GI1 covers the semiconductor pattern ACT and the buffer layer BFL.

The first gate insulting electrode GI1 may include an inorganic material. As an example, the first gate insulating layer GI1 may include at least one selected from silicon nitride ($SiN_x$), silicon oxide ($SiO_x$), silicon oxynitride ($SiOxN_y$), and aluminum oxide ($AlO_x$). According to embodiments, the first gate insulating layer GI1 may include an organic material.

The gate electrode GAT is positioned on the first gate insulating layer GI1. The gate electrode GAT may be positioned to overlap the channel region of the semiconductor pattern ACT.

A first capacitor electrode CE1 may be positioned on the first gate insulating layer GI1. The first capacitor electrode CE1 may form a capacitor C together with a second capacitor electrode CE2, to be described below.

From among the plurality of insulating layers GI1, GI2, ILD, INS1, INS2, and INS3, a second gate insulating layer GI2 is disposed on the gate electrode GAT and the first gate insulating layer GI1. The second gate insulating layer GI2 covers the gate electrode GAT and the first gate insulating layer GI1.

The second gate insulating layer GI2 may include the same material as the first gate insulating layer GI1 and may include, for example, at least one selected from silicon nitride ($SiN_x$), silicon oxide ($SiO_x$), silicon oxynitride ($SiOxN_y$), and aluminum oxide ($AlO_x$).

The second capacitor electrode CE2 may be positioned on the second gate insulating layer GI2.

From among the plurality of insulating layers GI1, GI2, ILD, INS1, INS2, and INS3, an interlayer insulating layer ILD is disposed on the second gate insulating layer GI2. The interlayer insulating layer ILD covers the second gate insulating layer GI2 and the second capacitor electrode CE2. The interlayer insulating layer ILD may include the same material as the second gate insulating layer GI2 and may include an inorganic material or an organic material.

The first source electrode TE1 and the first drain electrode TE2 are disposed on the interlayer insulating layer ILD. In some embodiments, the first source electrode TE1 may be the same component as the second terminal of the first transistor T1 shown in FIG. 4, and the first drain electrode TE2 may be the same component as the first terminal of the first transistor T1.

The first drain electrode TE1 may be electrically connected to a first electrode EL1 of a light-emitting element LD through a first contact opening (e.g., a first contact hole) CH1 in a first via layer VIA1, a first bridge electrode BRD1, a second contact opening (e.g., a second contact hole) CH2 in a second via layer VIA2, a second bridge electrode BRD2, a third contact opening (e.g., a third contact hole) CH3 in a third via layer VIA3, a first connection electrode CNE1, and a third connection electrode CNE3. Accordingly, the transistor TR may transmit a voltage of a second driving power source VSS (see, e.g., FIG. 4) to the first electrode EL1.

From among the plurality of via layers VIA1, VIA2, and VIA3, the first via layer VIA1 is disposed on the first source electrode TE1, the first drain electrode TE2, and the interlayer insulating layer ILD. The first via layer VIA1 covers the first source electrode TE1, the first drain electrode TE2, and the interlayer insulating layer ILD.

The first via layer VIA1 may include at least one organic insulating layer. The first via layer VIA1 may be a single layer or may have a multi-layer structure and may include an inorganic insulating material or an organic insulating material. For example, the first via layer VIA1 may include at least one selected from an acrylic-based based resin, an epoxy-based resin, a phenolic resin, a polyamide-based resin, and a polyimide-based resin.

The first drain electrode TE2 and the first bridge electrode BRD1 may be physically and/or electrically connected to each other via the first contact opening CH1 in the first via layer VIA1.

From among the plurality of insulating layers GI1, GI2, ILD, INS1, INS2, and INS3, a first insulating layer INS1 is disposed on the first via layer VIA1. The first insulating layer INS1 may include an inorganic material. As an example, the first insulating layer INS1 may include at least one selected from silicon nitride ($SiN_x$), silicon oxide ($SiO_x$), silicon oxynitride ($SiOxN_y$), and aluminum oxide ($AlO_x$). According to embodiments, the first insulating layer INS1 may include an organic material. The first drain electrode TE2 and the first bridge electrode BRD1 may be physically and/or electrically connected to each other via the first contact opening CH1 in the first insulating layer INS1.

The first bridge electrode BRD1 is positioned on the first insulating layer INS1.

From among the plurality of via layers VIA1, VIA2, and VIA3, the second via layer VIA2 is disposed on the first insulating layer INS1 and the first bridge electrode BRD1. The second via layer VIA2 may include the same material as the first via layer VIA1. For example, the second via layer VIA2 may include at least one selected from an acrylic-based resin, an epoxy-based resin, a phenolic resin, a polyamide-based resin, and a polyimide-based resin.

The first bridge electrode BRD1 and the second bridge electrode BRD2 may be physically and/or electrically connected to each other via the second contact opening CH2 in the second via layer VIA2.

From among the plurality of insulating layers GI1, GI2, ILD, INS1, INS2, and INS3, a second insulating layer INS2 is disposed on the second via layer VIA2. The second insulating layer INS2 may include the same material as the first insulating layer INS1. For example, the second insulating layer INS2 may include at least one selected from silicon nitride ($SiN_x$), silicon oxide ($SiO_x$), silicon oxynitride ($SiOxN_y$), and aluminum oxide ($AlO_x$). According to embodiments, the second insulating layer INS2 may include an organic material.

The first bridge electrode BRD1 and the second bridge electrode BRD2 may be physically and/or electrically connected to each other via the second contact opening CH2 in the second insulating layer INS2.

The second bridge electrode BRD2 is positioned on the second insulating layer INS2. In addition, a driving voltage line DVL is positioned on the second insulating layer INS2.

From among the plurality of via layers VIA1, VIA2, and VIA3, the third via layer VIA3 is disposed on the second insulating layer INS2, the second bridge electrode BRD2, and the driving voltage line DVL. The third via layer VIA3 may include the same material as the second via layer VIA2. For example, the third via layer VIA3 may include at least one selected from an acrylic-based resin, an epoxy-based resin, a phenolic resin, a polyimide-based resin, and a polyimide-based resin.

The second bridge electrode BRD2 and the first connection electrode CNE1, to be described below, may be physically and/or electrically connected to each other via the third contact opening CH3 in the third via layer VIA3. In addition, the driving voltage line DVL and a second connection electrode CNE2, to be described below, may be physically and/or electrically connected to each other via a fourth contact opening (e.g., a fourth contact hole) CH4 in the third via layer VIA3.

From among the plurality of insulating layers GI1, GI2, ILD, INS1, INS2, and INS3, a third insulating layer INS3 is disposed on the third via layer VIA3. The third insulating layer INS3 may include the same material as the second insulating layer INS2. For example, the third insulating layer INS3 may include at least one selected from silicon nitride ($SiN_x$), silicon oxide ($SiO_x$), silicon oxynitride ($SiOxN_y$), and aluminum oxide ($AlO_x$). According to embodiments, the third insulating layer INS3 may include an organic material.

The display element layer DPL may include connection electrodes CNE1, CNE2, CNE3, and CNE4, a fourth via layer VIA4, a fourth insulating layer INS4, a first bump BUM1, a second bump BUM2, and the light-emitting element LD, and an insulating film FIL.

The connection electrodes CNE1, CNE2, CNE3, and CNE4 may include the first connection electrode CNE1, the second connection electrode CNE2, the third connection electrode CNE3, and a fourth connection electrode CNE4.

The first connection electrode CNE1 may be positioned on the pixel circuit layer PCL. The first connection electrode CNE1 may be physically and/or electrically connected to the second bridge electrode BRD2 through the third contact opening CH3 in the third insulating layer INS3 and the third via layer VIA3.

The second connection electrode CNE2 may be positioned on the pixel circuit layer PCL and may be coplanar with the first connection electrode CNE1. The second connection electrode CNE2 may be physically and/or electrically connected to the driving voltage line DVL through the fourth contact opening CH4 in the third insulating layer INS3 and the third via layer VIA3. The driving voltage line DVL may correspond to (or may be) a portion of the first power line PL1 described with reference to FIG. 4.

The first connection electrode CNE1 and the second connection electrode CNE2 may be formed as a single layer including (or made of) one selected from the group consisting of copper (Cu), titanium (Ti), aluminum (Al), silver (Ag), gold (Au), and an alloy or a mixture thereof or may have a double-layer or multi-layer structure including copper (Cu), titanium (Ti), aluminum (Al), silver (Ag), or gold (Au) to reduce line resistance. For example, the first connection electrode CNE1 and the second connection electrode CNE2 may have a triple-layer structure in which titanium (Ti), aluminum (Al), and titanium (Ti) are sequentially stacked.

The third connection electrode CNE3 may be positioned on the first connection electrode CNE1 and the first bump BUM1. The third connection electrode CNE3 may at least partially overlap the first connection electrode CNE1 and may be positioned to cover the first bump BUM1. The third connection electrode CNE3 may directly contact the first electrode EL1 of the light-emitting element LD and may be physically and/or electrically connected to the first electrode EL1 of the light-emitting element LD. Accordingly, the third connection electrode CNE3 may electrically connect the first electrode EU and the first connection electrode CNE1, and the first electrode EU may receive a driving current of the driving power source VSS (see, e.g., FIG. 4) from a driving transistor of the pixel circuit layer PCL.

The fourth connection electrode CNE4 may be positioned on the second connection electrode CNE2 and the second bump BUM2. The fourth connection electrode CNE4 may at least partially overlap the second connection electrode CNE2 and may be positioned to cover the second bump BUM2. The fourth connection electrode CNE4 may directly contact a second electrode EL2 of the light-emitting element LD and may be physically and/or electrically connected to the second electrode EL2 of the light-emitting element LD. Accordingly, the fourth connection electrode CNE4 may electrically connect the second electrode EL2 and the second connection electrode CNE2, and the second electrode EL2 may receive a voltage of the first driving power source VDD (see, e.g., FIG. 4) from the driving voltage line DVL of the pixel circuit layer PCL.

The third connection electrode CNE3 and the fourth connection electrode CNE4 may include a transparent conductive oxide, such as ITO, IZO, ZnO, IGZO, or ITZO. The present disclosure is not limited thereto, and according to embodiments, the third connection electrode CNE3 and the fourth connection electrode CNE4 may include an opaque metal, such as magnesium (Mg), aluminum (Al), silver (Ag), gold (Au), copper (Cu), tin (Sn), platinum (Pt), palladium (Pd), nickel (Ni), neodymium (Nd), iridium (Ir), chromium (Cr), titanium (Ti), and an oxide or alloy thereof alone or in a mixture.

The fourth via layer VIA4 (or a via layer) may be disposed on the pixel circuit layer PCL.

The fourth via layer VIA4 may be an organic insulating film including an organic material. For example, the fourth via layer VIA4 may include at least one selected from an acrylic-based resin (e.g., a polyacrylate-based resin), an epoxy-based resin, a phenolic-based resin, a polyamide-based resin, a polyimide-based resin, an unsaturated polyester-based resin, a polyphenylene ether-based resin, a polyphenylene sulfide-based resin, and a benzocyclobutene resin. However, the present disclosure is not limited thereto, and the fourth via layer VIA4 may include an inorganic material.

In addition, in one embodiment, the fourth via layer VIA4 may be a black pixel definition layer including (or made of) a negative photoresist material. In one embodiment, the fourth via layer VIA4 may include the same organic material as the second bump BUM2, to be described below.

The fourth insulating layer INS4 may be positioned on the fourth via layer VIA4 to cover the fourth via layer VIA4. The fourth insulating layer INS4 may include an inorganic material. For example, the fourth insulating layer INS4 may include at least one selected from metal oxides, such as silicon oxide ($SiO_x$), silicon nitride ($SiN_x$), silicon oxynitride ($SiOxN_y$), and aluminum oxide ($AlO_x$). However, the present disclosure is not limited thereto, and the fourth insulating layer INS4 may include an organic material.

The first bump BUM1 may be positioned on the first connection electrode CNE1.

The second bump BUM2 may be positioned on the second connection electrode CNE2.

The first bump BUM1 may have a half-moon oval shape that is long in (e.g., is extended in) a third direction DR3 in a cross-sectional view. Accordingly, a shape of the third connection electrode CNE3 covering the first bump BUM1 may correspond to a shape of the first bump BUM1. For example, in one embodiment, the third connection electrode CNE3 may have a long half-moon oval shape in a cross-sectional view. However, the present disclosure is not limited thereto, and the shape of the first bump BUM1 may be variously modified. In one embodiment, a height hh1 of the first bump BUM1 may be in a range of about 1.5 μm to about 3 μm, and a diameter dd1 of the first bump BUM1 may correspond to a range of about 3 μm to about 6 μm.

The second bump BUM2 may have a half-moon oval shape that is long in the third direction DR3 in a cross-sectional view. Accordingly, a shape of the fourth connection electrode CNE4 covering the second bump BUM2 may correspond to a shape of the second bump BUM2. For example, in one embodiment, the fourth connection electrode CNE4 may have a long half-moon oval shape in a cross-sectional view. However, the present disclosure is not limited thereto, and the shape of the second bump BUM2 may be variously modified. In an embodiment, a height hh2 of the second bump BUM2 to which the light-emitting element LD is coupled may be less than the height hh1 of the first bump BUM1, but a diameter dd2 of the second bump BUM2 may be greater than the diameter dd1 of the first bump BUM1. In one embodiment, the height hh2 of the second bump BUM2 may be in a range of about 1.5 μm to about 3 μm, and the diameter dd2 of the second bump BUM2 may be in a range of about 3 μm to about 6 μm.

The first bump BUM1 may include an organic material. For example, the first bump BUM1 may include a positive photoresist material. The present disclosure is not limited thereto, however, and according to embodiments, the first bump BUM1 may include a metal material.

The second bump BUM2 may include an organic material different from that of the first bump BUM1. For example, the second bump BUM2 may include a negative photoresist material. The present disclosure is not limited thereto, however, and according to embodiments, the second bump BUM2 may include a metal material having an elastic modulus that is less than that of the first bump BUM1. In addition, the second bump BUM2 may include various organic materials having elastic moduli that are less than that of the first bump BUM1.

In one embodiment, the second bump BUM2 may include the same material as the fourth via layer VIA4. The present disclosure is not limited thereto, and the second bump BUM2 may include a material different from that of the fourth via layer VIA4. A material (or materials) constituting the first bump BUM1 and the second bump BUM2 will be described in detail below with reference to FIGS. 8 to 17.

In one embodiment, the first bump BUM1 may include a material having an elastic modulus that is greater than that of the second bump BUM2. Accordingly, even when the same pressure is applied on the first bump BUM1 and the second bump BUM2, the second bump BUM2 may be more deformed than the first bump BUM1. That is, a deformation amount of the second bump BUM2 may be greater than a deformation amount of the first bump BUM1 under the same load or pressure. Accordingly, when the light-emitting element LD is coupled to the substrate SUB such that the first electrode EL1 and the second electrode EL2 face downwardly in the third direction DR3, because the second bump BUM2 that is in contact with the second electrode EL2 is more deformed than the first bump BUM1 a contact resistance between the light-emitting element LD and the pixel circuit layer PCL (or a circuit board or a substrate) may be decreased despite a height difference (or step difference) between the first electrode EL1 and the second electrode EL2. Accordingly, a bonding force between the light-emitting element LD and the substrate may be improved (or strengthened).

The light-emitting element LD may be positioned on the third connection electrode CNE3 and the fourth connection electrode CNE4. In one embodiment, the light-emitting element LD may be positioned such that the first electrode EL1 and the second electrode EL2 face the third connection electrode CNE3 and the fourth connection electrode CNE4 in the third direction DR3, respectively. Because a semiconductor structure 10 of the light-emitting element LD includes a mesa interface, the first electrode EU and the second electrode EL2 may have different heights.

The first electrode EU of the light-emitting element LD may directly contact the third connection electrode CNE3 and may overlap the first bump BUM1.

The second electrode EL2 of the light-emitting element LD may directly contact the fourth connection electrode CNE4 and may overlap the second bump BUM2.

The insulating film FIL may be disposed on the fourth insulating layer INS4, the third connection electrode CNE3, and the fourth connection electrode CNE4.

The insulating film FIL may be positioned between the light-emitting element LD and the circuit board. Here, the circuit board may refer to the substrate SUB, the pixel circuit layer PCL, and a portion of the display element layer DPL together.

For example, the insulating film FIL may be positioned between the light-emitting element LD and the third and fourth connection electrodes CNE3 and CNE4. In more detail, the insulating film FIL may be positioned between the light-emitting element LD and the third connection electrode CNE3 to couple the light-emitting element LD and the circuit board and may be disposed between the light-emitting element LD and the fourth connection electrode CNE4 to couple the light-emitting element LD and the circuit board.

In one embodiment, the insulating film FIL may be a non-conductive film (NCF). The present disclosure is not limited thereto, however, and the insulating film FIL may include (or may be made of) an insulating material and may correspond to various materials having a bonding force.

In the display device according to an embodiment, the light-emitting element LD can be stably coupled to the circuit board by the first bump BUM1, the second bump BUM2, the third connection electrode CNE3, the fourth connection electrode CNE4, and the insulating film FIL.

Hereinafter, a material constituting the first bump and the second bump described with reference to FIG. 7 will be described in more detail with reference to FIGS. 8 to 17.

Figure 8:
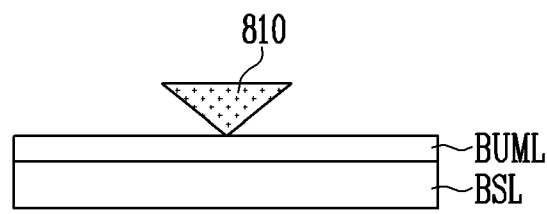
FIG. 8 is a view describing an experiment to determine physical properties of a material forming a first bump and a second bump of a pixel according to an embodiment.
Figure 9:
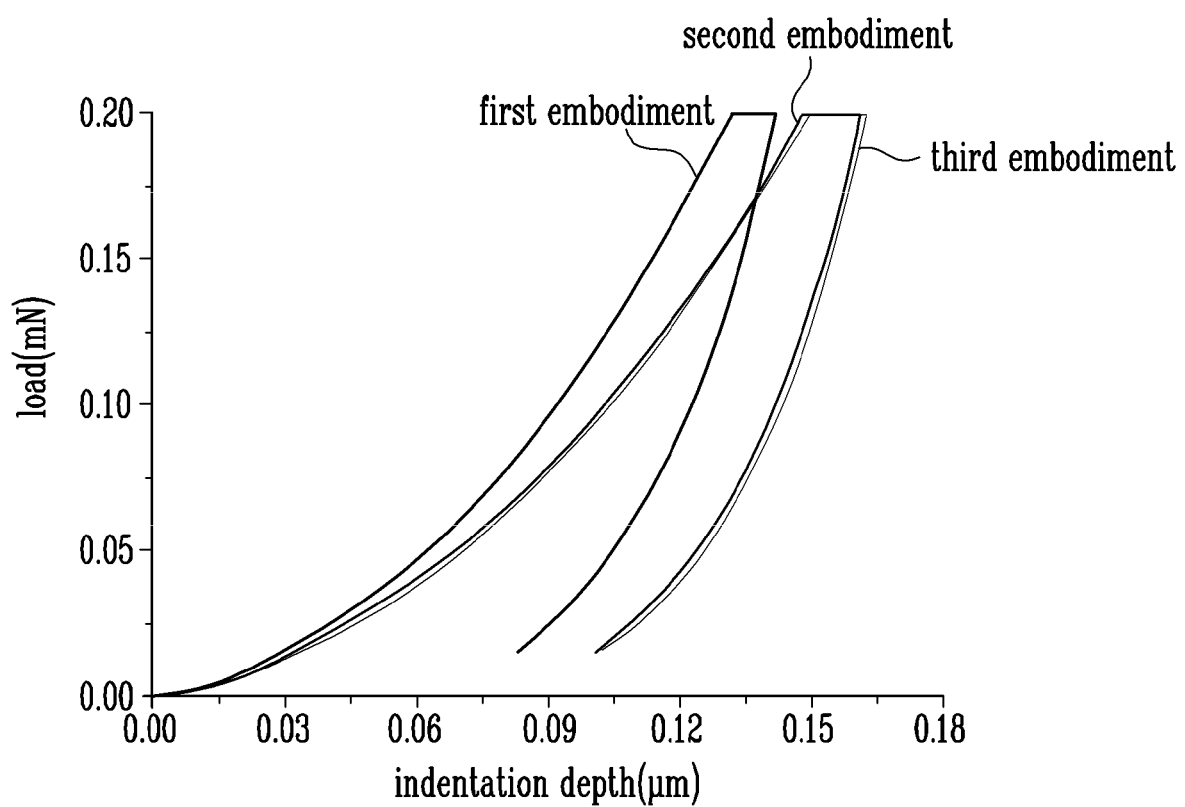
FIG. 9 is a graph describing experiment results relevant to FIG. 8.
Figure 11:
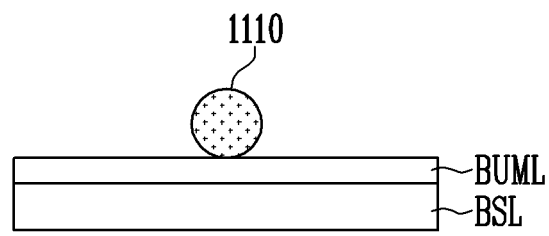
FIG. 11 is a view describing an experiment to determine physical properties of a material forming a first bump and a second bump of a pixel according to an embodiment.
Figure 12:
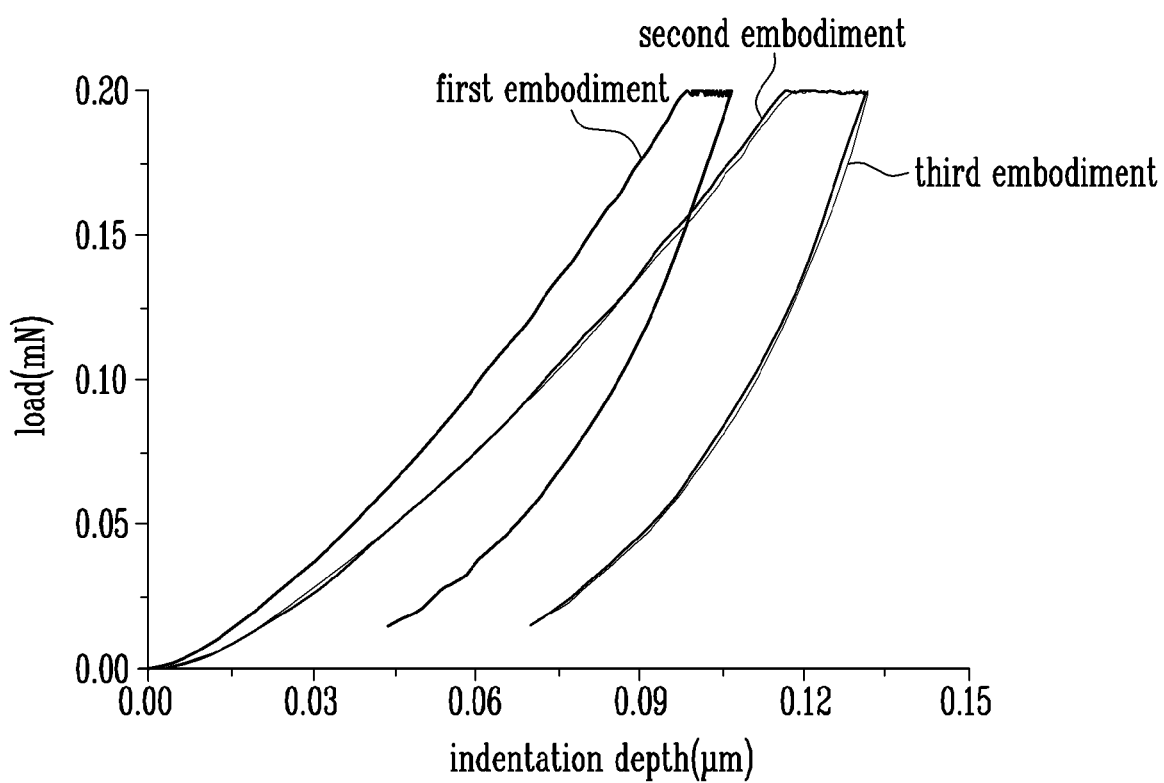
FIG. 12 is a graph describing experiment results relevant to FIG. 11.
Figure 14:
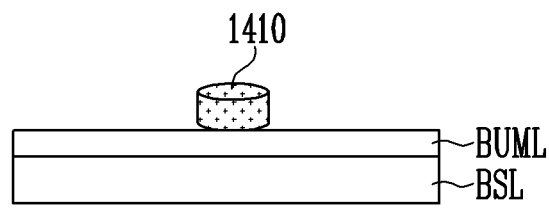
FIG. 14 is a view describing an experiment to determine physical properties of a material forming a first bump and a second bump of a pixel according to an embodiment.
Figure 15:
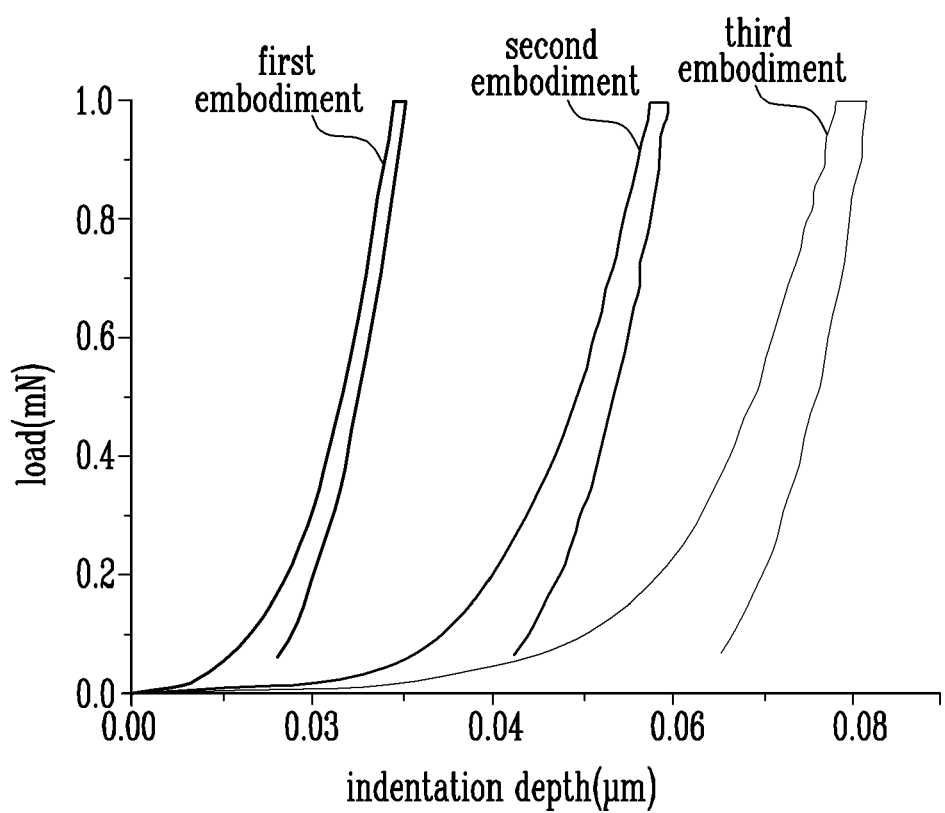
FIG. 15 is a graph describing experiment results relevant to FIG. 14.
Figure 17:
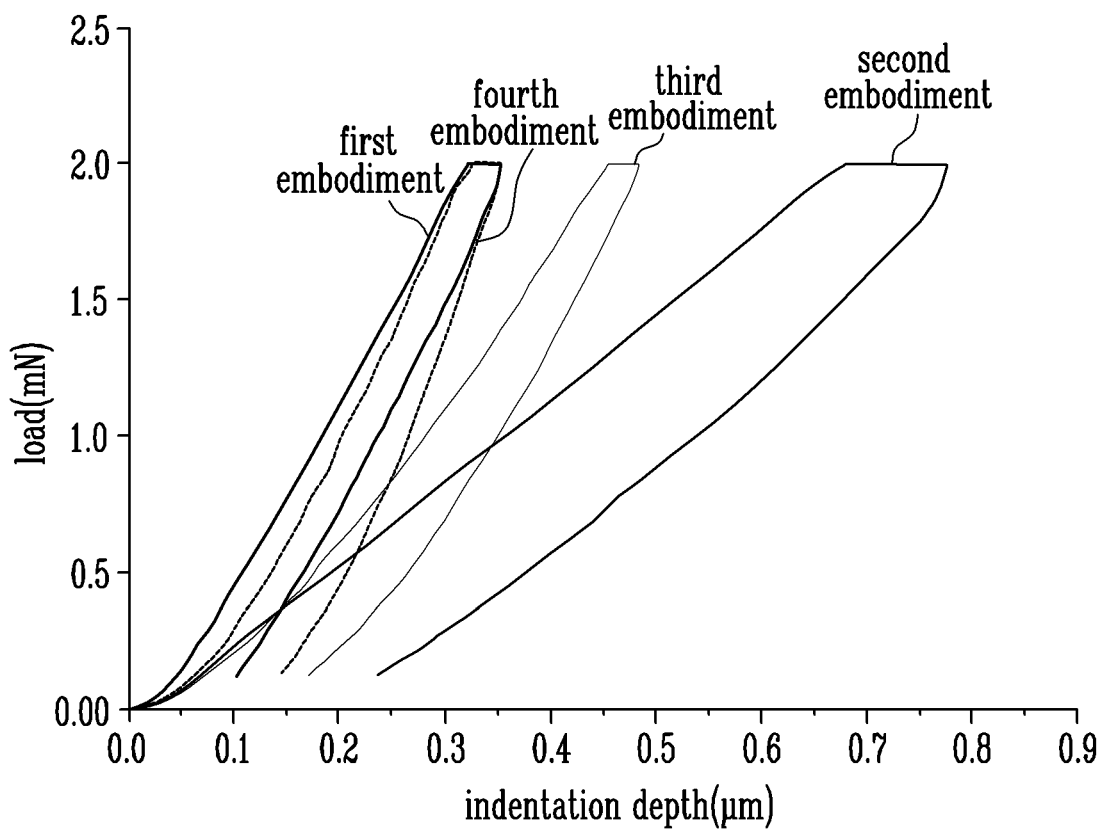
FIG. 17 is a graph showing a relationship between an indentation depth and a load according to a material forming a first bump and a second bump of a pixel according to an embodiment.

FIG. 8 is a view describing an experiment of physical properties of a material constituting a first bump and a second bump of a pixel according to an embodiment, FIG. 9 is a graph describing experiment results of FIG. 8, and FIG. 10 is a table describing the experiment results of FIG. 8. FIG. 11 is a view describing an experiment of physical properties of a material constituting a first bump and a second bump of a pixel according to an embodiment, FIG. 12 is a graph for describing experiment results of FIG. 11, and FIG. 13 is a table for describing the experiment results of FIG. 11. FIG. 14 is a view describing an experiment of physical properties of a material constituting a first bump and a second bump of a pixel according to an embodiment, FIG. 15 is a graph for describing experiment results of FIG. 14, and FIG. 16 is a table for describing the experiment results of FIG. 14. FIG. 17 is a graph showing a relationship between an indentation depth and a load according to a material constituting a first bump and a second bump of a pixel according to an embodiment.

First, referring to FIGS. 8 to 16, the materials constituting the first bump and the second bump of the pixel according to one embodiment may be classified into a first embodiment, a second embodiment, and a third embodiment. The material of each embodiment may be positioned on a base layer BSL (see, e.g., FIGS. 8, 11, and 14) as a bump layer BUML. For example, in a first experiment, the bump layer BUML may be provided as that of the first embodiment and may be positioned on the base layer BSL, in a second experiment, the bump layer BUML may be provided as that of the second embodiment and may be positioned on the base layer BSL, and in a third experiment, the bump layer BUML may be provided as that of the third embodiment and may be positioned on the base layer BSL. Here, the base layer BSL may be made of glass, and the bump layer BUML may be a single layer.

Referring to FIG. 8, an object 810 having an inverted triangular shape in a cross-sectional view (or having an inverted triangular cross-sectional shape) is positioned on the bump layer BUML. Thereafter, a reference pressure (e.g., a predetermined pressure) may be applied to the object 810 to measure an indentation depth according to a load applied to the bump layer BUML.

Referring to FIG. 11, an object 1110 having a circular shape in a cross-sectional view is positioned on the bump layer BUM. Thereafter, a reference pressure (e.g., a predetermined pressure) may be applied to the object 1110 to measure an indentation depth according to a load applied to the bump layer BUML.

Referring to FIG. 14, an object 1410 having a cylindrical shape is positioned on the bump layer BUML. Thereafter, a reference pressure (e.g., a predetermined pressure) may be applied to the object 1410 to measure an indentation depth according to a load applied to the bump layer BUML.

A contact area between an upper surface of the bump layer BUML and the object 810 having the inverted triangular shape may be less than a contact area between the upper surface of the bump layer BUML and the object 1110 having the circular shape. The contact area between the upper surface of the bump layer BUML and the object 1110 having the circular shape may be less than a contact area between the upper surface of the bump layer BUML and the object 1410 having the cylindrical shape.

The first embodiment may correspond to a material constituting a first bump BUM1. For example, the first embodiment may correspond to a material using polyimide as a binder from among positive photoresist materials.

The second embodiment and the third embodiment may correspond to materials constituting a second bump BUM2. For example, the second embodiment and the third embodiment may correspond to a material using cardo acrylate as a binder from among negative photoresist materials. The second embodiment and the third embodiment may correspond to a black pixel definition film and may correspond to a material that transmits different wavelengths (e.g., different wavelengths of light) according to an initiator. The black pixel definition film may refer to a black organic layer. When an organic layer corresponds to a pixel definition film included in a display element layer, the display element layer may include the black pixel definition film.

The second embodiment may transmit a short wavelength (e.g., about 365 nm), and the third embodiment may transmit a short wavelength and a long wavelength (e.g., about 400 nm).

Materials constituting the first, second, and third embodiments in the present disclosure are not limited to the above-described examples. According to embodiments, when a material constituting the first embodiment is an organic material, that is, a material having an elastic modulus greater than that of the materials constituting the second and third embodiments, the material may correspond to a material constituting the first bump BUM1 and the second bump BUM2.

Accordingly, referring to FIG. 9, when the bump layer BUML corresponds to the first embodiment, even when the same load (or pressure) is applied, an indentation depth may be shallow as compared with the second embodiment and the third embodiment. For example, referring to FIG. 10, a hardness and an elastic modulus of the first embodiment may be greater than those of the second embodiment, and the hardness and the hardness and the elastic modulus of the second embodiment may be greater than those of the third embodiment. In addition, when a load of 0.2 mN is applied, the first embodiment may have an indentation depth of about 0.14 μm, and when a load of 0.2 mN is applied, the second and third embodiments may have an indentation depth of about 0.16 μm. In the case of the experiment described with respect to FIG. 8, results of the second embodiment and the third embodiment may be similar. In one embodiment, when the bump layer BUML corresponds to the first embodiment, even when the same load is applied, an elastic strain thereof has a value that is smaller than that of the second embodiment and the third embodiment (e.g., an elastic modulus is greater than that of the second embodiment and the third embodiment), and with respect to the same pressure, a deformation amount of the second bump BUM2 may be greater than that of the first bump BUM1. Accordingly, because the second bump BUM2 that contacts a second electrode EL2 is more deformed than the first bump BUM1, a contact resistance between a light-emitting element LD and a pixel circuit layer PCL (or a circuit board or a substrate) can be decreased despite a height difference (or step difference) between the first electrode EL1 and the second electrode EL2. Accordingly, a bonding force between the light-emitting element LD and the substrate may be improved (or strengthened).

Referring to FIG. 12, when the bump layer BUML corresponds to the first embodiment, even when the same load (or pressure) is applied, an indentation depth may be shallow when compared with the second embodiment and the third embodiment. For example, referring to FIG. 13, when a load of 0.2 mN is applied, the first embodiment may have an indentation depth of about 0.11 μm, and when a load of 0.2 mN is applied, the second and third embodiments may have an indentation depth of about 0.13 μm. In the case of the experiment described with respect to FIG. 11, results of the second embodiment and the third embodiment may be similar. In one embodiment, when the bump layer BUML corresponds to the first embodiment, even when the same load is applied, the elastic strain value thereof is smaller than that of the second embodiment and the third embodiment (e.g., an elastic modulus has a value greater than that of the second embodiment and the third embodiment), and with respect to the same pressure, a deformation amount of the second bump BUM2 may be greater than that of the first bump BUM1. Accordingly, because the second bump BUM2 that contacts the second electrode EL2 is more deformed than the first bump BUM1, a contact resistance between the light-emitting element LD and the pixel circuit layer PCL (or the circuit board or the substrate) can be decreased despite a height difference (or step difference) between the first electrode EL1 and the second electrode EL2. Accordingly, a bonding force between the light-emitting element LD and the substrate may be strengthened.

Referring to FIG. 15, when the bump layer BUML corresponds to the first embodiment, even when the same load (or pressure) is applied, an indentation depth may be shallow when compared with the second embodiment and the third embodiment. In addition, when the bump layer BUML corresponds to the second embodiment, even when the same load (or pressure) is applied, an indentation depth may be shallow when compared with the third embodiment. For example, referring to FIG. 16, when a load of 1 mN is applied, the first embodiment may have an indentation depth of about 0.03 µm, when a load of 1 mN is applied, the second embodiment may have an indentation depth of about 0.06 µm, and when a load of 1 mN is applied, the third embodiment may have an indentation depth of about 0.08 µm. In one embodiment, when the bump layer BUML corresponds to the first embodiment, even when the same load is applied, the elastic strain value is greater than that of the second embodiment and the third embodiment (e.g., an elastic modulus has a value smaller than that of the second embodiment and the third embodiment), and with respect to the same pressure, a deformation amount of the second bump BUM2 may be greater than that of the first bump BUM1. Accordingly, because the second bump BUM2 that contacts the second electrode EL2 is more deformed than the first bump BUM1, a contact resistance between the light-emitting element LD and the pixel circuit layer PCL (or the circuit board or the substrate) can be decreased despite a height difference (or step difference) between the first electrode EL1 and the second electrode EL2. Accordingly, a bonding force between the light-emitting element LD and the substrate may be improved (or strengthened).

Referring to FIG. 17, materials constituting the first bump and the second bump of the pixel according to an embodiment may be classified into a first embodiment, a second embodiment, a third embodiment, and a fourth embodiment. The first embodiment, the second embodiment, and the third embodiment may be the same as the first embodiment, the second embodiment, and the third embodiment described above with reference to FIGS. 8 to 16.

The fourth embodiment may correspond to a material constituting a second bump BUM2. For example, the fourth embodiment may correspond to a material using cardo acrylate and epoxy as a binder from among negative photoresist materials. The fourth embodiment may correspond to a black pixel definition film and may correspond to a material that transmits different wavelengths according to an initiator. For example, the fourth embodiment may transmit a short wavelength (e.g., about 350 nm).

When the first bump BUM1 corresponds to the first embodiment, even when the same load is applied, an indentation depth may be shallow when compared with the second bump BUM2 that corresponds to the fourth embodiment. For example, when a load of 2 mN or less is applied to the first bump BUM1 and the second bump BUM2, an indentation depth of the first embodiment (the first bump BUM1) is shallower than that of the fourth embodiment (the second bump BUM2). Accordingly, in one embodiment, when a bump layer BUML corresponds to the first embodiment, even when the same load is applied, the elastic strain value is smaller than that of the fourth embodiment (e.g., an elastic modulus value is greater than that of the fourth embodiment), and with respect to the same pressure, a deformation amount of the second bump BUM2 may be greater than that of the first bump BUM1. Accordingly, because the second bump BUM2 that contacts a second electrode EL2 is more deformed than the first bump BUM1, a contact resistance between a light-emitting element LD and a pixel circuit layer PCL (or a circuit board or a substrate) can be decreased despite a height difference (or step difference) between the first electrode EL1 and the second electrode EL2. Accordingly, a bonding force between the light-emitting element LD and the substrate may be improved (or strengthened).

Hereinafter, a method of manufacturing a display device according to an embodiment will be described with reference to FIGS. 18 to 20.

Figure 18:
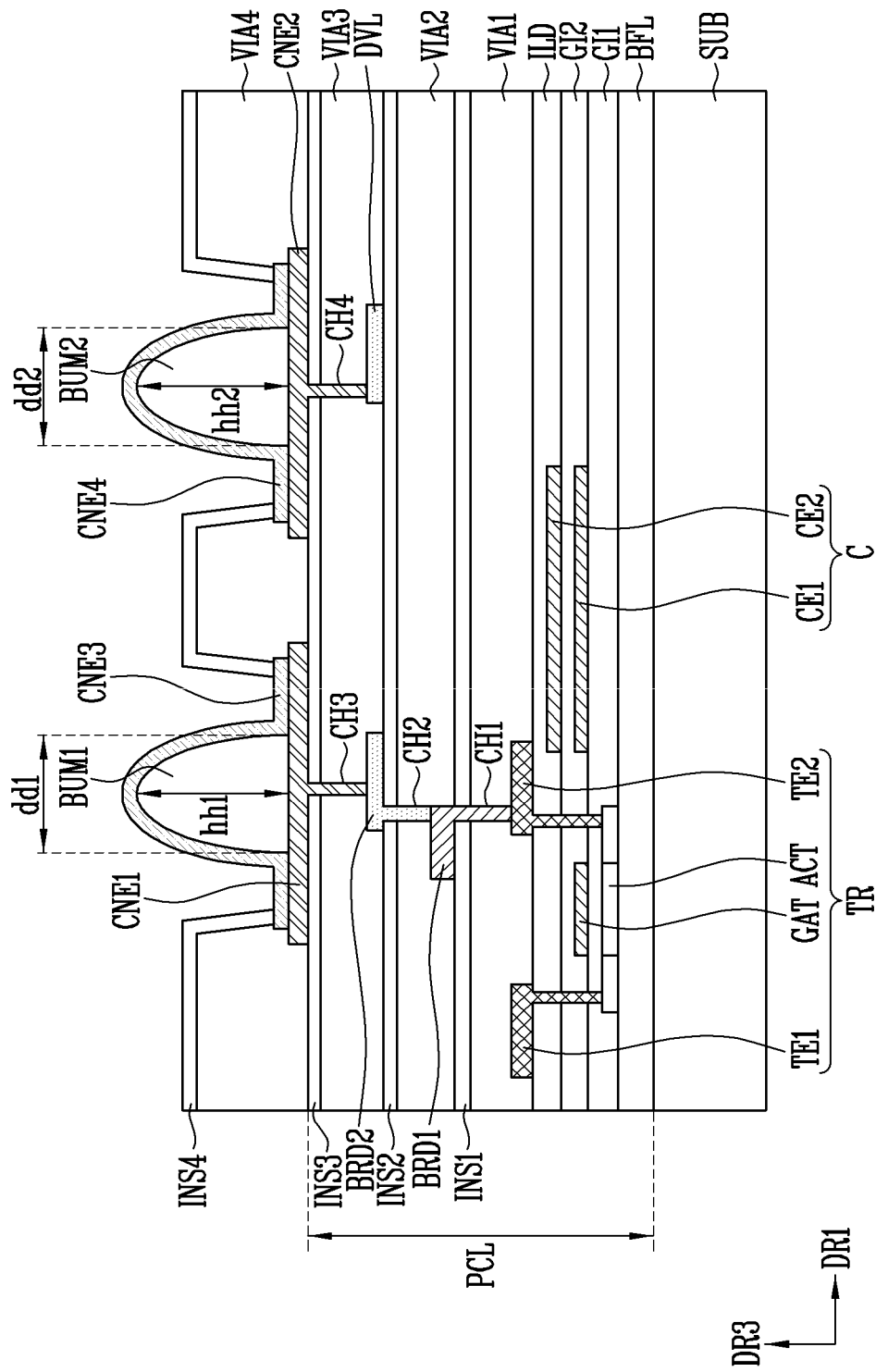
FIGS. 18 to 20 are cross-sectional views sequentially illustrating steps of a method of manufacturing a display device according to one embodiment.
Figure 19:
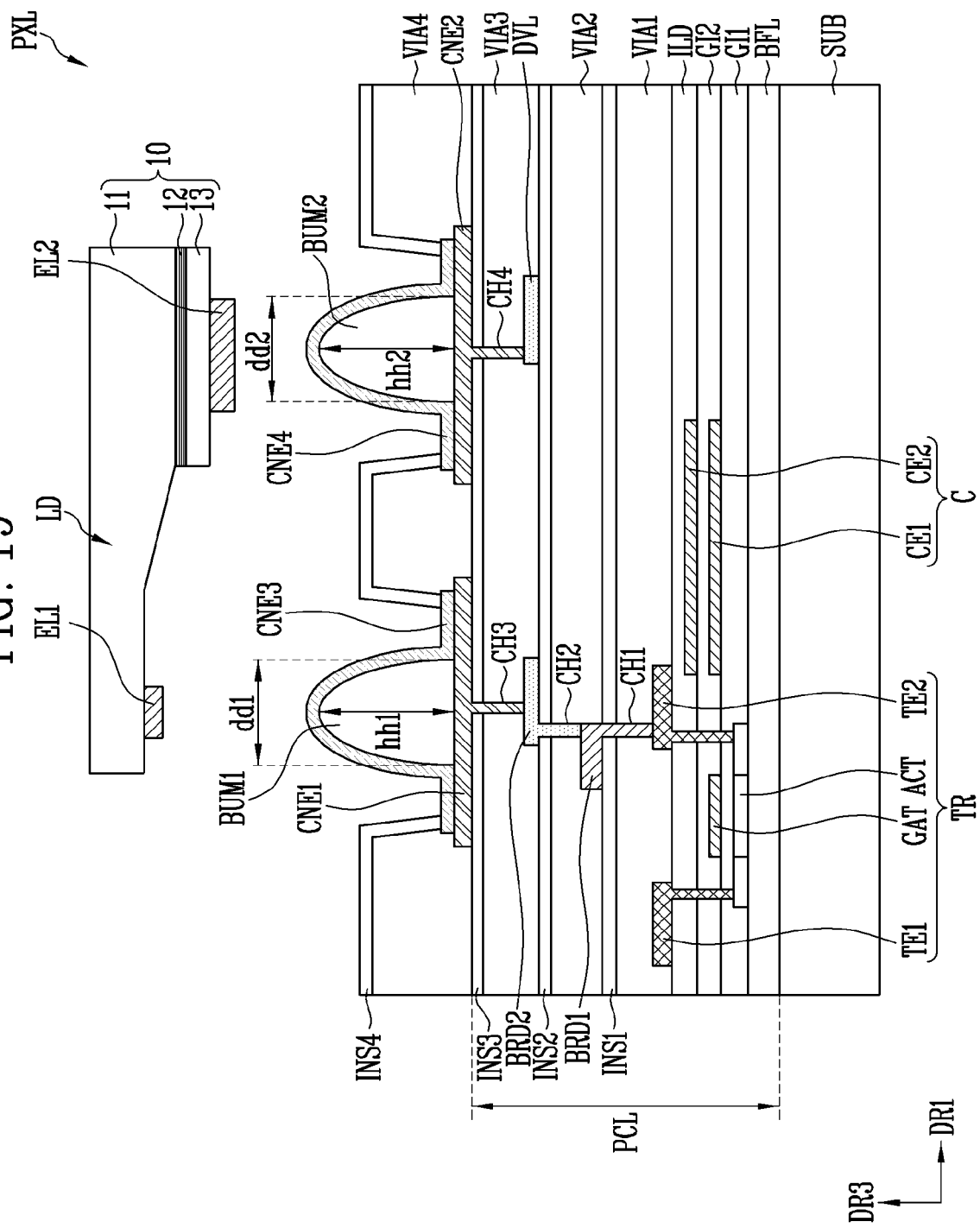
Figure 20:
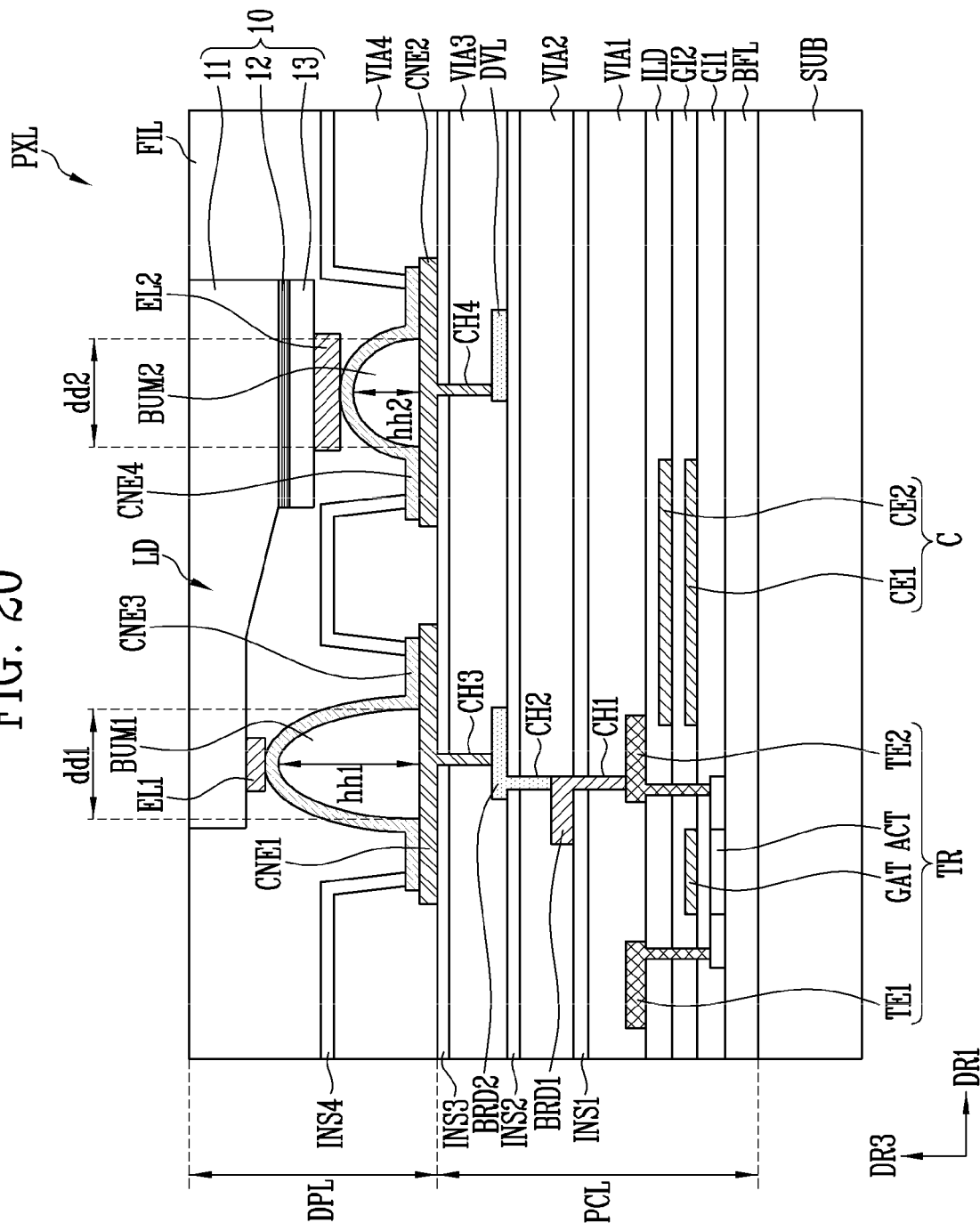

FIGS. 18 to 20 are cross-sectional views sequentially illustrating steps of a method of manufacturing a display device according to an embodiment.

Referring to FIG. 18, a display device according to an embodiment may include a pixel in which a pixel circuit layer PCL including a transistor TR is formed on a substrate SUB, and first to fourth connection electrodes CNE1, CNE2, CNE3, and CNE4, a first bump BUM1, a second bump BUM2, a fourth via layer VIA4 (or a via layer), and a fourth insulating layer INS4 are provided on the pixel circuit layer PCL.

The first bump BUM1 may be provided on the first connection electrode CNE1, and the third connection electrode CNE3 may be disposed to cover the first bump BUM1 and at least partially overlap the first connection electrode CNE1.

The second bump BUM2 may be provided on the second connection electrode CNE2, and the fourth connection electrode CNE4 may be disposed to cover the second bump BUM2 and at least partially overlap the fourth connection electrode CNE4.

The first bump BUM1 and the second bump BUM2 may include materials having different elastic moduli. For example, an elastic modulus of the first bump BUM1 may be greater than an elastic modulus of the second bump BUM2. In such an embodiment, a height hh1 of the first bump BUM1 may be the same as or similar to a height hh2 of the second bump BUM2, and a diameter dd1 of the first bump BUM1 may be the same as or similar to a diameter dd2 of the second bump BUM2. Thus, before a light-emitting element LD is coupled onto the substrate SUB, sizes and/or shapes of the first bumps BUM1 and the second bumps BUM2 may be the same or similar.

In an embodiment, the first bump BUM1 and the second bump BUM2 may include an organic material or a metal material. Contents of the materials constituting (or forming) the first bump BUM1 and the second bump BUM2 are the same as those described, in detail, with reference to FIGS. 7 to 17 and, thus, will not be described again hereinafter.

In addition, the second bump BUM2 and the fourth via layer VIA4 may include the same material. For example, the second bump BUM2 and the fourth via layer VIA4 may include a negative photoresist material. In one embodiment, the second bump BUM2 and the fourth via layer VIA4 may include the same material and may be manufactured through the same process. Accordingly, time and costs for manufacturing a display device can be reduced.

Referring to FIG. 19, in the display device according to an embodiment, a light-emitting element LD including a first electrode EL1 and a second electrode EL2 may be disposed on the substrate SUB.

The light-emitting element LD may be disposed such that, in a third direction DR3, the first electrode EL1 faces the first bump BUM1 and the third connection electrode CNE3 and the second electrode EL2 faces the second bump BUM2 and the fourth connection electrode CNE4.

Referring to FIG. 20, in the display device according to an embodiment, a reference (or predetermined) pressure may be applied in the third direction DR3 to couple the light-emitting element LD and the substrate SUB. Accordingly, the first electrode EL1 may directly contact the third connection electrode CNE3, and the second electrode EL2 may directly contact the fourth connection electrode CNE4.

Because the first bump BUM1 has an elastic modulus that is greater than that of the second bump BUM2, the second bump BUM2 may be deformed more than the first bump BUM1. Accordingly, because the second bump BUM2 that contacts the second electrode EL2 is more deformed than the first bump BUM1, the light-emitting element LD can be stably coupled to the substrate SUB despite a height difference (or step difference) between the first electrode EL1 and the second electrode EL2. In such an embodiment, the height (e.g., the final height) hh1 of the first bump BUM1 may be greater than the height (e.g., the final height) hh2 of the second bump BUM2, and the diameter (e.g., the final diameter) dd1 of the first bump BUM1 may be less than the diameter (e.g., the final diameter) dd2 of the second bump BUM2. Thus, after the light-emitting element LD is coupled onto the substrate SUB, sizes and/or shapes of the first bumps BUM1 and the second bumps BUM2 may be changed.

Thereafter, an insulating film FIL including an insulating material may be formed between the light-emitting element LD and the third and fourth connection electrodes CNE3 and CNE4. The insulating film FIL may be positioned between the light-emitting element LD and the third connection electrode CNE3 to couple the light-emitting element LD and a circuit board and may be disposed between the light-emitting element LD and the fourth connection electrode CNE4 to couple the light-emitting element LD and the circuit board.

According to an embodiment, a first bump and a second bump having different elastic moduli are provided, thereby strengthening a bonding force between a substrate and a light-emitting element including a first electrode and a second electrode that are positioned at different levels.

Aspects and features of the present disclosure are not restricted to those described above with respect to embodiments described herein, and more diverse aspects and feature are included in the present specification.

Although embodiments of the present disclosure have been described, it is understood that the present disclosure should not be limited to these embodiments but various changes and modifications can be made by one ordinary skilled in the art within the spirit and scope of the disclosure as hereinafter claimed and their equivalents.

Therefore, the technical scope of the present disclosure is not limited to the embodiments described herein but should be determined by claims and their equivalents.

What is claimed is:

1. A display device comprising:
    a substrate;
    a pixel circuit layer on the substrate;
    a first connection electrode and a second connection electrode on the pixel circuit layer;
    a first bump on the first connection electrode, and a second bump on the second connection electrode, the first bump and the second bump comprising materials having different elastic moduli; and
    a light-emitting element comprising a first electrode electrically connected to the first connection electrode and a second electrode electrically connected to the second connection electrode.

2. The display device of claim 1, wherein the elastic modulus of the first bump is greater than the elastic modulus of the second bump.

3. The display device of claim 2, wherein the first bump and the second bump comprise an organic material or a metal material.

4. The display device of claim 1, wherein the first bump comprises a positive photoresist material, and the second bump comprises a negative photoresist material.

5. The display device of claim 1, wherein a height of the second bump is lower than a height of the first bump, and a diameter of the second bump is greater than a diameter of the first bump.

6. The display device of claim 1, wherein the light-emitting element comprises a semiconductor structure having one surface with different heights and that is configured to emit light, and
    wherein the first electrode is on the one surface of the semiconductor structure, and the second electrode is on the one surface of the semiconductor structure and is different from the first electrode.

7. The display device of claim 6, wherein the first electrode is at a lower level on the one surface of the semiconductor structure, and
    wherein the second electrode is at a higher level on the one surface of the semiconductor structure.

8. The display device of claim 7, wherein the semiconductor structure comprises a first semiconductor layer, an active layer at one side of the first semiconductor layer, and a second semiconductor layer at one side of the active layer and being a different type from the first semiconductor layer.

9. The display device of claim 1, wherein the pixel circuit layer comprises a transistor on the substrate and a plurality of via layers on the transistor, the transistor comprising a semiconductor pattern, a first source electrode, a first drain electrode, and a gate electrode, and
    wherein the first drain electrode of the transistor is electrically connected to the first connection electrode through contact openings in the plurality of via layers.

10. The display device of claim 9, further comprising a third connection electrode covering the first bump and at least partially overlapping the first connection electrode and a fourth connection electrode covering the second bump and at least partially overlapping the second connection electrode.

11. The display device of claim 10, further comprising an insulating film between the light-emitting element and the third and fourth connection electrodes.

12. A display device comprising:
    a substrate;
    a pixel circuit layer on the substrate;
    a via layer on the pixel circuit layer;
    a first connection electrode and a second connection electrode on the pixel circuit layer;
    a first bump on the first connection electrode, and a second bump on the second connection electrode, the first bump and the second bump comprising materials having different elastic moduli, the second bump and the via layer comprising the same material; and
    a light-emitting element comprising a first electrode electrically connected to the first connection electrode and a second electrode electrically connected to the second connection electrode.

13. The display device of claim 12, wherein the elastic modulus of the first bump is greater than the elastic modulus of the second bump.

14. The display device of claim 13, wherein the via layer, the first bump, and the second bump include an organic material.

15. The display device of claim 12, wherein a height of the second bump is lower than a height of the first bump, and
    wherein a diameter of the second bump is greater than a diameter of the first bump.

16. The display device of claim 12, wherein the light-emitting element comprises a semiconductor structure having one surface with different heights and configured to emit light,
wherein the first electrode is on the one surface of the semiconductor structure, and the second electrode is on the one surface of the semiconductor structure and is different from the first electrode.

17. The display device of claim 16, wherein the first electrode is at a lower level on the one surface of the semiconductor structure, and
wherein the second electrode is at a higher level on the one surface of the semiconductor structure.

18. A tiled display device comprising:
a plurality of display devices and a seaming portion disposed between the plurality of display devices, a first display device of the plurality of display devices comprising:
a substrate;
a pixel circuit layer on the substrate;
a first connection electrode and a second connection electrode on the pixel circuit layer;
a first bump on the first connection electrode and a second bump on the second connection electrode, the first bump and the second bump comprising materials having different elastic moduli; and
a light-emitting element comprising a first electrode electrically connected to the first connection electrode and a second electrode electrically connected to the second connection electrode.

19. The tiled display device of claim 18, wherein each of the light-emitting elements is a flip chip-type of micro light-emitting diode.

20. The tiled display device of claim 18, wherein the substrate is made of glass.

21. The tiled display device of claim 18, wherein the first display device further comprises:
a pad on a first surface of the substrate; and
a side wire on the first surface of the substrate, a second surface opposite to the first surface, and one side surface between the first surface and the second surface, the side wire being connected to the pad.

22. The tiled display device of claim 21, wherein the first display device further comprises:
a connecting wire on the second surface of the substrate; and
a flexible film connected to the connecting wire through a conductive adhesive member, and
wherein the side wire is connected to the connecting wire.

23. The tiled display device of claim 18, wherein the plurality of display devices are arranged in a matrix format having M rows and N columns.

24. The tiled display device of claim 18, wherein the elastic modulus of the first bump is greater than the elastic modulus of the second bump.

25. The tiled display device of claim 24, wherein the first bump and the second bump comprise an organic material or a metal material.

26. The tiled display device of claim 18, wherein the first bump comprises a positive photoresist material, and
wherein the second bump comprises a negative photoresist material.

27. The tiled display device of claim 18, wherein a height of the second bump is lower than a height of the first bump, and
wherein a diameter of the second bump is greater than a diameter of the first bump.

28. The tiled display device of claim 18, wherein the light-emitting element comprises a semiconductor structure having one surface with different heights and that is configured to emit light,
wherein the first electrode is on the one surface of the semiconductor structure, and
wherein the second electrode is on the one surface of the semiconductor structure and is different from the first electrode.

29. The tiled display device of claim 28, wherein the first electrode is at a lower level on the one surface of the semiconductor structure, and
wherein the second electrode is at a higher level on the one surface of the semiconductor structure.

30. The tiled display device of claim 29, wherein the semiconductor structure comprises a first semiconductor layer, an active layer at one side of the first semiconductor layer, and a second semiconductor layer at one side of the active layer and being a different type from the first semiconductor layer.

31. The tiled display device of claim 18, wherein the pixel circuit layer comprises a transistor on the substrate and a plurality of via layers on the transistor, the transistor comprising a semiconductor pattern, a first source electrode, a first drain electrode, and a gate electrode, and
wherein the first drain electrode of the transistor is electrically connected to the first connection electrode through contact openings in the plurality of via layers.

32. The tiled display device of claim 31, further comprising a third connection electrode covering the first bump and at least partially overlapping the first connection electrode and a fourth connection electrode covering the second bump and at least partially overlapping the second connection electrode.

33. The tiled display device of claim 32, further comprising an insulating film between the light-emitting element and the third and fourth connection electrodes.

* * * * *